United States Patent
Ji

(10) Patent No.: US 12,206,377 B2
(45) Date of Patent: Jan. 21, 2025

(54) IMPEDANCE MATCHING CIRCUIT, METHOD FOR IMPEDANCE MATCHING AND SEMICONDUCTOR MEMORY

(71) Applicant: CHANGXIN MEMORY TECHNOLOGIES, INC., Hefei (CN)

(72) Inventor: Yifan Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 156 days.

(21) Appl. No.: 18/168,640

(22) Filed: Feb. 14, 2023

(65) Prior Publication Data

US 2024/0048126 A1 Feb. 8, 2024

Related U.S. Application Data

(63) Continuation of application No. PCT/CN2022/112130, filed on Aug. 12, 2022.

(30) Foreign Application Priority Data

Aug. 3, 2022 (CN) .......................... 202210927224.1

(51) Int. Cl.
G11C 11/40 (2006.01)
G11C 11/4093 (2006.01)
(Continued)

(52) U.S. Cl.
CPC ......... *H03H 11/28* (2013.01); *G11C 11/4093* (2013.01); *H03K 5/24* (2013.01);
(Continued)

(58) Field of Classification Search
CPC ................ H03H 11/28; G11C 11/4093; G11C 2207/2254; G11C 29/022; G11C 29/028;
(Continued)

(56) References Cited

U.S. PATENT DOCUMENTS 10,659,258 B1 * 5/2020 Ramirez ............. H04L 25/0278
11,196,418 B1 12/2021 Suryanarayana
(Continued)

FOREIGN PATENT DOCUMENTS

CN 101256826 A 9/2008
CN 110289031 A 9/2019
(Continued)

OTHER PUBLICATIONS

Yong-Un Jeong et al. "A 0.64-pJ/Bit 28-GB/s/Pin High-Linearity Single-Ended PAM-4 Transmitter With an Impedance-Matched Driver and Three-Point ZQ Calibration for Memory Interface", in IEEE Journal of Solid-State Circuits, vol. 56, No. 4, Apr. 2021. https://sci-hub.ru/10.1109/JSSC.2020.3042240, 10 pages.

*Primary Examiner* — Xiaochun L Chen
(74) *Attorney, Agent, or Firm* — Syncoda LLC; Feng Ma

(57) ABSTRACT

An impedance matching circuit includes a driver circuit, a calibration circuit, a digital logic circuit, a receiving circuit and a first resistor. An output of the driver circuit is connected to the receiving circuit, and an output of the calibration circuit is connected to the first resistor. The calibration circuit is configured to cooperate with the driver circuit to perform calibration according to the impedance values of the first resistor and the receiving circuit to determine a plurality of calibration parameters obtained at different output level values. The digital logic circuit is configured to receive the plurality of calibration parameters and determine a respective target calibration parameter of each of the at least one transistor slice in the driver circuit. The driver circuit is configured to receive the target calibration parameter, and perform impedance adjustment on the at least one transistor slice according to the target calibration parameter.

20 Claims, 8 Drawing Sheets

(51) Int. Cl.
*H03H 11/28* (2006.01)
*H03K 5/24* (2006.01)
*H03K 17/687* (2006.01)
*H03K 19/20* (2006.01)

(52) U.S. Cl.
CPC ......... *H03K 17/6872* (2013.01); *H03K 19/20* (2013.01); *G11C 2207/2254* (2013.01)

(58) Field of Classification Search
CPC ............... G11C 29/50008; H03K 5/24; H03K 17/6872; H03K 19/20; H03K 19/0005
See application file for complete search history.

(56) References Cited

U.S. PATENT DOCUMENTS

| | | |
|---|---|---|
| 2008/0211534 A1 | 9/2008 | Jeong |
| 2010/0202227 A1 | 8/2010 | Nguyen |
| 2019/0044769 A1 | 2/2019 | Hollis |
| 2019/0215202 A1 | 7/2019 | Hollis |
| 2022/0076716 A1 | 3/2022 | Um et al. |
| 2023/0370065 A1* | 11/2023 | Murai .................. G11C 7/1084 |

FOREIGN PATENT DOCUMENTS

| | | |
|---|---|---|
| CN | 110914904 A | 3/2020 |
| CN | 114242129 A | 3/2022 |

* cited by examiner

IMPEDANCE MATCHING CIRCUIT, METHOD FOR IMPEDANCE MATCHING AND SEMICONDUCTOR MEMORY

CROSS-REFERENCE TO RELATED APPLICATIONS

This is a continuation of International Application No. PCT/CN2022/112130, filed on Aug. 12, 2022, which is filed based upon and claims priority to Chinese patent application No. 202210927224.1, filed on Aug. 3, 2022 and entitled "IMPEDANCE MATCHING CIRCUIT, METHOD FOR IMPEDANCE MATCHING AND SEMICONDUCTOR MEMORY". The disclosures of International Application No. PCT/CN2022/112130 and Chinese patent application No. 202210927224.1 are hereby incorporated by reference in their entireties.

TECHNICAL FIELD

The disclosure relates to the technical field of semiconductors, and in particular to an impedance matching circuit, a method for impedance matching and a semiconductor memory.

BACKGROUND

With the continuous development of semiconductor technology, people manufacturing and using devices such as computers have higher and higher requirements on the speed of data transmission. In order to achieve a greater data transmission speed, a series of memory devices have been developed in which data can be transmitted at Double Data Rate (DDR). However, it is difficult to meet the requirements of high capacity and high speed data transmission when signal modulation is performed based on a Non-Return-to-Zero (NRZ) mode.

In recent years, in some transmitter circuits, research on a Pulse Amplitude Modulation (PAM) method has been actively conducted to explore an alternative solution suitable for large capacity and high speed data transmission. However, the existing PAM method still has shortcomings, especially due to the influence of process angle, temperature, voltage and other factors, resulting in unstable output impedance of a transmitter, and seriously affecting the signal integrity.

SUMMARY

According to a first aspect, embodiments of the disclosure provide an impedance matching circuit. The impedance matching circuit may include a driver circuit, a calibration circuit, a digital logic circuit, a receiving circuit and a first resistor. An output of the driver circuit is connected to the receiving circuit, and an output of the calibration circuit is connected to the first resistor.

The calibration circuit is configured to cooperate with the driver circuit to perform calibration according to impedance values of the first resistor and the receiving circuit, so as to determine a plurality of calibration parameters obtained at different output level values.

The digital logic circuit is configured to receive the plurality of calibration parameters and determine a respective target calibration parameter of each of at least one transistor slice in the driver circuit.

The driver circuit is configured to receive the target calibration parameter, and perform impedance adjustment on the at least one transistor slice according to the target calibration parameter, to form an impedance matching relationship between the impedance value of the driver circuit and the impedance value of the receiving circuit at different output level values.

According to a second aspect, the embodiments of the disclosure provide a method for impedance matching, which may include the following operations.

An impedance value of a first resistor connected to a calibration circuit and an impedance value of a receiving circuit connected to a driver circuit are determined.

The calibration circuit cooperates with the driver circuit to perform calibration according to the impedance values of the first resistor and the receiving circuit, to determine a plurality of calibration parameters obtained at different output level values.

A respective target calibration parameter of each of at least one transistor slice in the driver circuit is determined by a digital logic circuit according to the plurality of calibration parameters.

Impedance adjustment is performed on the at least one transistor slice in the driver circuit according to the target calibration parameter, to form an impedance matching relationship between the impedance value of the driver circuit and the impedance value of the receiving circuit at different output level values.

According to a third aspect, the embodiments of the disclosure provide a semiconductor memory. The semiconductor memory at least includes an impedance matching circuit as in the first aspect.

DETAILED DESCRIPTION

Figure 1:
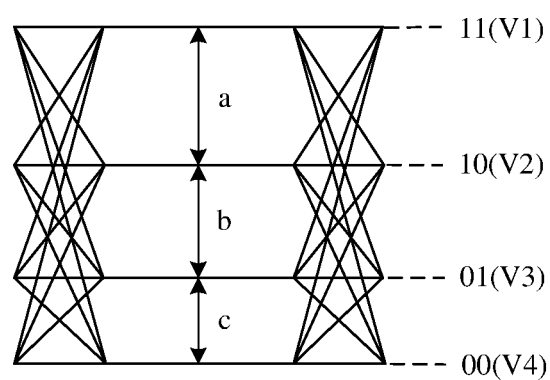
FIG. 1 is a schematic diagram of a basic principle for defining output linearity.

Technical solutions in the embodiments of the disclosure are clearly and completely described below in combination with the drawings in the embodiments of the disclosure. It is to be understood that the specific embodiments described herein are merely illustrative of the disclosure and are not intended to limit the disclosure. In addition, it is also to be noted that, for ease of description, only the parts related to the relevant disclosure are shown in the drawings.

Unless otherwise defined, all technological and scientific terms used in the disclosure have meanings the same as those usually understood by those skilled in the art of the disclosure. The terms used in the disclosure are only adopted to describe the embodiments of the disclosure and not intended to limit the disclosure.

"Some embodiments" involved in the following descriptions describes a subset of all possible embodiments. However, it can be understood that "some embodiments" may be the same subset or different subsets of all the possible embodiments, and may be combined without conflicts.

It is to be pointed out that terms "first/second/third" involved in the embodiments of the disclosure are only for distinguishing similar objects and do not represent a specific sequence of the objects. It can be understood that "first/second/third" may be interchanged to specific sequences or orders if allowed to implement the embodiments of the disclosure described herein in sequences except the illustrated or described ones.

It is also to be pointed out that the high level and low level used by a signal related to the embodiments of the present disclosure refer to logic level of the signal. A signal with a high level is different from a signal with a low level. For example, the high level may correspond to a signal with a first voltage, and the low level may correspond to a signal with a second voltage. In some embodiments, the first voltage is greater than the second voltage. In addition, the logic level of the signal may be different from or opposite to the described logic level. For example, a signal described as having a logic "high" level may alternatively have a logic "low" level, and a signal described as having a logic "low" level may alternatively have a logic "high" level.

It is to be understood that, in a Dynamic Random Access Memory (DRAM), a transmitter circuit mostly uses a Not Return to Zero (NRZ) signal for transmission, and the signal integrity thereof is greatly reduced with the increase of speed. The requirements for equalization technology and high-speed clock are getting higher and higher, so the embodiments of the disclosure introduce Four-level Pulse Amplitude Modulation (PAM4), which can improve the profit rate of signal spectrum.

In the related art, a PAM4-based transmitter circuit is mostly applied to a Serializer-Deserializer (serdes) circuit, which is generally a differential channel. The main difference of a serdes circuit and a Low Power (LP) DDR interface circuit is that in a serdes circuit, a clock is not separately transmitted, and the speed may be very high. Therefore, the output signal of the PAM4-based transmitter circuit shall have good linearity and signal integrity to ensure that a receiving end can recognize the data. Exemplarily, FIG. 1 provides a schematic diagram of how to define output linearity. As shown in FIG. 1, four level values of an output data signal may be mapped to two bits of input signals respectively. For example, the highest level value (represented by V1) may be mapped to "11", the lowest level value (represented by V4) may be mapped to "00", and the two level values (represented by V2 and V3) in the middle may be mapped to "10" and "01". The interval between two adjacent level values is represented by a, b and c in turn, and then the definition of linearity is as follows:

$$RLM = \frac{\min(a, b, c)}{(a+b+c)/3} \quad (1)$$

Figure 2:
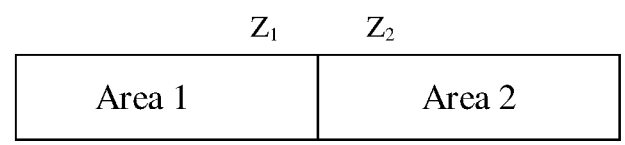
FIG. 2 is a schematic diagram of a basic principle of impedance matching.

In addition, due to the influence of process angle, temperature, voltage and other factors, the output impedance of the transmitter circuit is not fixed, and therefore, a Zero Quantity (ZQ) calibration circuit is needed for impedance calibration to ensure signal integrity. Exemplarily, FIG. 2 provides a schematic diagram of a basic principle of impedance matching. As shown in FIG. 2, the impedance value of an area 1 may be Z1, and the impedance value of an area 2 may be Z2. Through Z1 and Z2, impedance matching between the area 1 and the area 2 may be implemented. A reflection coefficient and a transmission coefficient are defined as follows:

$$\Gamma = \frac{V_{reflect}}{V_{inc}} = \frac{Z_2 - Z_1}{Z_2 + Z_1} \quad (2)$$

$$T = \frac{V_{trans}}{V_{inc}} = \frac{2 \times Z_2}{Z_2 + Z_1} \quad (3)$$

Herein, $\Gamma$ represents the reflection coefficient; T represents the transmission coefficient; $V_{reflect}$ represents a reflected voltage, $V_{trans}$ represents voltage actually transmitted to Z2; and $V_{inc}$ represents the voltage originally transmitted by Z1. Here, if the impedances of Z1 and Z2 does not match, there may be a reflected voltage $V_{reflect}$.

In short, compared with a traditional NRZ ZQ calibration circuit, the characteristic of the PAM4-based ZQ calibration circuit is mainly embodied in that impedance matching needs to be ensured at different output levels. That is, impedance matching is achieved on the premise of ensuring the output linearity.

Based thereon, the embodiments of the disclosure provide an impedance matching circuit. The impedance matching circuit includes a driver circuit, a calibration circuit, a digital logic circuit, a receiving circuit and a first resistor. An output of the driver circuit is connected to the receiving circuit, and an output of the calibration circuit is connected to the first resistor. Herein, the calibration circuit is configured to cooperate with the driver circuit to perform calibration according to the impedance values of the first resistor and the receiving circuit to determine a plurality of calibration parameters at different output level values. The digital logic circuit is configured to receive the plurality of calibration parameters and determine a respective target calibration parameter of each of the at least one transistor slice in the driver circuit. The driver circuit is configured to receive the target calibration parameter, and perform impedance adjustment on the at least one transistor slice according to the target calibration parameter, to form an impedance matching relationship between the impedance value of the driver circuit and the impedance value of the receiving circuit at different output level values. Thus, due to the different transistor types in the driver circuit, the driver circuit has both the advantages of the NMOS and of PMOS transistors, thus avoiding the disadvantages of merely using the NMOS transistor(s) or merely using the PMOS transistor(s) as the pull-up transistor(s). Moreover, impedance adjustment is performed on the at least one transistor slice in the driver circuit by the calibration circuit and the digital logic circuit, so that there is an impedance matching relationship between the impedance value of the driver circuit and the impedance value of the receiving circuit at different output level values. Therefore, not only can the overall circuit area be saved, but also the signal integrity can be improved and the power consumption can be reduced while the output linearity is ensured, thus effectively improving the data transmission performance.

Various embodiments of the present disclosure will now be described in detail in combination with the accompanying drawings.

Figure 3:
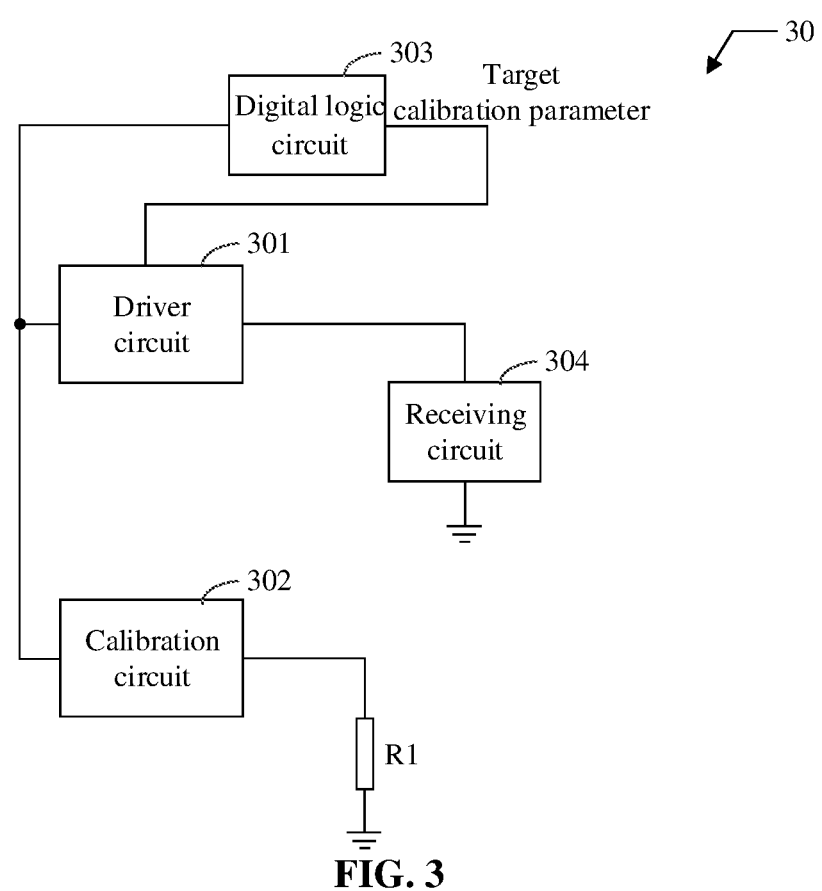
FIG. 3 is a structure diagram of an impedance matching circuit according to an embodiment of the disclosure.

In an embodiment of the disclosure, referring to FIG. 3, which illustrates a composition structure diagram of an impedance matching circuit according to an embodiment of the disclosure. As shown in FIG. 3, the impedance matching circuit 30 may include a driver circuit 301, a calibration circuit 302, a digital logic circuit 303, a receiving circuit 304, and a first resistor R1. The output of the driver circuit 301 is connected to the receiving circuit 304, and the output of the calibration circuit 302 is connected to the first resistor R1.

The calibration circuit 302 is configured to cooperate with the driver circuit to perform calibration according to impedance values of the first resistor and the receiving circuit to determine a plurality of calibration parameters at different output level values.

The digital logic circuit 303 is configured to receive the plurality of calibration parameters and determine a respective target calibration parameter of each of at least one transistor slice in the driver circuit 301.

The driver circuit 301 is configured to receive the target calibration parameter, and perform impedance adjustment on the at least one transistor slice according to the target calibration parameter, to form an impedance matching relationship between the impedance value of the driver circuit 301 and the impedance value of the receiving circuit 304 at different output level values.

It is to be noted that, in the embodiment of the disclosure, the impedance matching circuit 30 may be applied not only to a PAM4-based circuit, but also to a PAM3-based circuit, and even compatible with a traditional transmitter circuit based on an NRZ signal. That is, the impedance matching circuit 30 according to the embodiment of the disclosure is good in compatibility and can be applied to various circuit scenarios based on NRZ, PAM3, PAM4, etc.

It is to be noted that NRZ is a line code used to represent 0 and 1 bits. A positive voltage represents logic 1, and a negative voltage represents logic 0. Since the NRZ signal has only two levels, the NRZ signal may also be referred to as a signal based on PAM2. PAM4 is a line code using a pulse amplitude modulation (PAM) technology. A PAM4 signal has four levels, corresponding to logic bits 00, 01, 10 and 11 respectively. In other words, each symbol encoded by PAM4 consists of 2 bits, which correspond to a voltage level, namely an amplitude. Herein, bits per second (bps) indicates the total number of bits 0 or 1 transmitted per second. Baud rate indicates the number of symbols sent per second. For the NRZ signal, the symbol rate is the same as the bit rate, and the baud rate and bits per second are the same as well. But for the PAM4 signal, they are different. Specifically, the number of symbols transmitted per second (baud rate) is half the number of bits transmitted per second. Thus, compared with a traditional NRZ signal, PAM4 allows twice as much information as the NRZ signal to be transmitted in each symbol period. Therefore, at the same bit rate, the baud rate (also referred to as symbol rate) of PAM4 is only half that of the NRZ signal, which greatly reduces the signal loss caused by transmission channel based on PAM4. Based thereon, detailed description is made below with PAM4 as a main application scenario. However, the embodiments of the disclosure are not limited to this application scenario.

Figure 4:
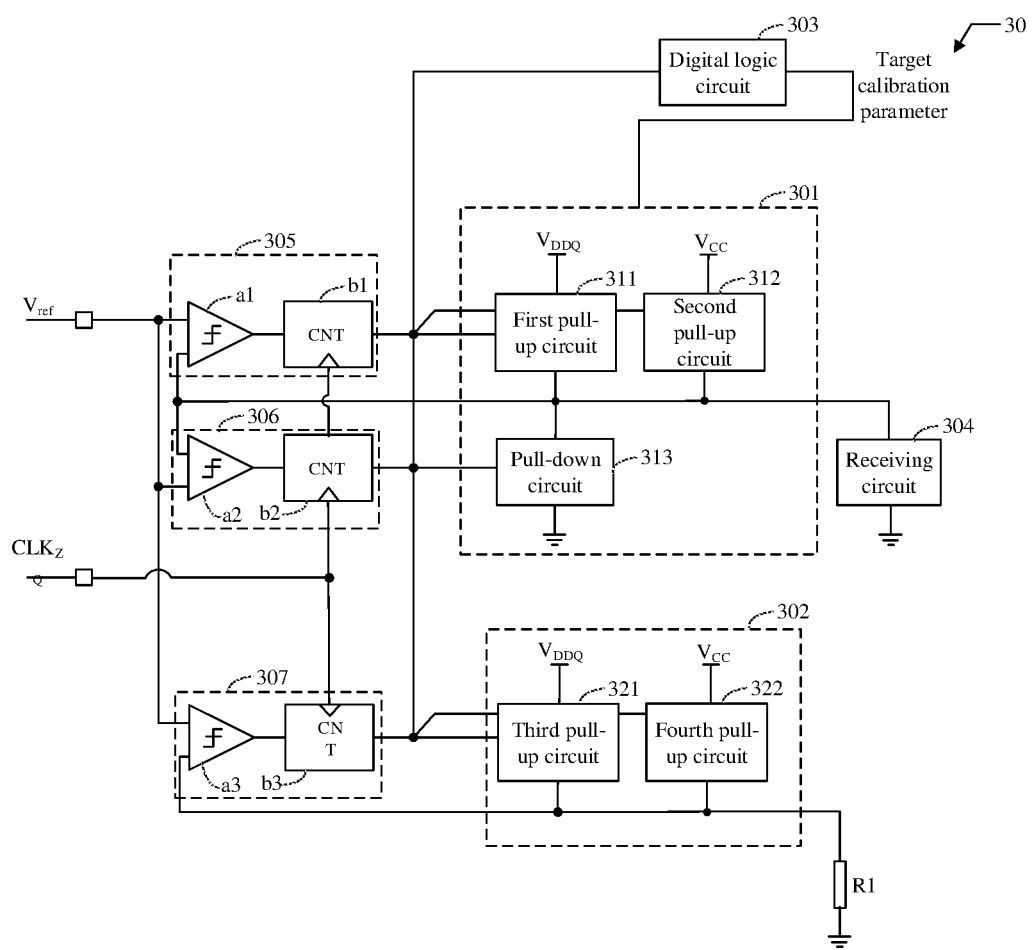
FIG. 4 is a composition structure diagram of another impedance matching circuit according to an embodiment of the disclosure.

It is also to be noted that in the embodiment of the disclosure, based on the impedance matching circuit 30 shown in FIG. 3, referring to FIG. 4, the driver circuit 301 may include a first pull-up circuit 311, a second pull-up circuit 312 and a pull-down circuit 313, and the calibration circuit 302 includes a third pull-up circuit 321 and a fourth pull-up circuit 322.

Herein, one end of the first pull-up circuit 311 and one end of the third pull-up circuit 321 are both connected to a first power supply.

One end of the second pull-up circuit 312 and one end of the fourth pull-up circuit 322 are both connected to a second power supply.

One end of the pull-down circuit 313 is grounded. The other end of the first pull-up circuit 311, the other end of the second pull-up circuit 312 and the other end of the pull-down circuit 313 are all connected to the input of the receiving circuit 304, and the output of the receiving circuit 304 is grounded.

The other end of the third pull-up circuit 321 and the other end of the fourth pull-up circuit 322 are both connected to one end of the first resistor R1, and the other end of the first resistor is grounded.

In the embodiment of the disclosure, for the driver circuit 301, the transistors included in the first pull-up circuit 311 and the second pull-up circuit 312 may be referred to as pull-up transistors, and the transistors included in the pull-down circuit 313 may be referred to as pull-down transistors. For the calibration circuit 302, the transistors included in the third pull-up circuit 321 and the fourth pull-up circuit 322 may also be referred to as pull-up transistors. Herein, the transistors in the pull-up transistor may include a PMOS transistor(s) and an NMOS transistor(s), and the transistors in the pull-down transistor may be of an-NMOS transistor type.

That is, two pull-up circuits (the first pull-up circuit 311 and the second pull-up circuit 312) in the driver circuit 301 include different transistor types, while two pull-up circuits (the third pull-up circuit 321 and the fourth pull-up circuit 322) in the calibration circuit 302 also include different transistor types. In some embodiments, the transistor types in the first pull-up circuit 311 and the third pull-up circuit 321 are NMOS transistors, and the transistor types in the second pull-up circuit 312 and the fourth pull-up circuit 322 are PMOS transistors. Or, the transistor types in the first pull-up circuit 311 and the third pull-up circuit 321 are PMOS transistors, and the transistor types in the second pull-up circuit 312 and the fourth pull-up circuit 322 are NMOS transistors. Thus, the driver circuit 301 has both the advantages of the PMOS transistor and of the NMOS transistor in terms of pull-up, and the disadvantages of using the NMOS transistor or the PMOS transistor as pull-up transistor alone can be avoided.

Further, the first power supply connected to the first pull-up circuit 311 and the third pull-up circuit 321 is different from the second power supply connected to the second pull-up circuit 312 and the fourth pull-up circuit 322. In some embodiments, in the case where the transistors in the first pull-up circuit 311 and the third pull-up circuit 321 are of an NMOS-transistor type and the transistor in the second pull-up circuit 312 and the fourth pull-up circuit 322 are of a PMOS-transistor type, the value of the first power supply is lower than the value of the second power supply.

In the embodiment of the disclosure, the power supply voltage of the PMOS transistor is higher than the power supply voltage of the NMOS transistor. Therefore, if the transistors in the first pull-up circuit 311 and the third pull-up circuit 321 are of the NMOS-transistor type, and the transistors in the second pull-up circuit 312 and the fourth pull-up circuit 322 are of the PMOS-transistor type, the value of the first power supply may be determined to be lower than the value of the second power supply. Or, if the transistors in the first pull-up circuit 311 and the third pull-up circuit 321 are of the PMOS-transistor type, and the transistors in the second pull-up circuit 312 and the fourth pull-up circuit 322 are of the NMOS-transistor type, the value of the first power supply may be determined to be higher than the value of the second power supply.

It is to be understood that since the power supply voltage of the PMOS transistor is higher than the power supply voltage of the NMOS transistor, for the PMOS transistors, the power supply voltage of the PMOS transistors is relatively high, so that a larger signal swing can be implemented to reduce the demand on the receiving end. For the NMOS transistors, the power supply voltage of the NMOS transistors is lower, so they have smaller output load capacitance, better linearity and lower power consumption. Thus, for the impedance matching circuit 30 in the embodiment of the disclosure, since the pull-up circuit of the impedance matching circuit 30 has both NMOS and PMOS transistors, on the one hand, compared with the related art in which the pull-up circuit only includes the NMOS transistors, the signal swing can be increased, thereby reducing the demand on the receiving end. On the other hand, compared with the related art in which the pull-up circuit only includes the PMOS transistors, they have smaller output load capacitance, and thus have advantages in terms of signal integrity, linearity and power consumption.

In the embodiment of the disclosure, assuming that the transistors in the first pull-up circuit 311 and the third pull-up circuit 321 are of the NMOS-transistor type and the transistors in the second pull-up circuit 312 and the fourth pull-up circuit 322 are of the PMOS-transistor type, the first power supply may be represented by $V_{DDQ}$, and the second power supply may be represented by $V_{CC}$. It is to be noted, unless otherwise specified, that detailed description is made to the following technical solution with the transistors in the first pull-up circuit 311 and the third pull-up circuit 321 being of the NMOS-transistor type, the transistors in the second pull-up circuit 312 and the fourth pull-up circuit 322 being of the PMOS-transistor type, and the transistors in the pull-down circuit being of the NMOS transistor type.

It is also to be understood that the driver circuit 301 may output target data signals with multiple levels, and there is an impedance matching relationship between the impedance value of the driver circuit and the impedance value of the receiving circuit at different output level values. In some embodiments, the driver circuit 301 is further configured to output a target data signal based on PAMn. Herein, n is an integer greater than or equal to 2.

It is to be noted that in the embodiment of the disclosure, if n is equal to 4, the target data signal may include four output level values, such as 0.45V, 0.3V, 0.15V and 0V. There is absolutely a maximum level value (such as 0.45V) among these four output level values. Herein, the maximum level value based on PAM4 output may be provided using a mixture of PMOS and NMOS transistors as pull-up transistors, while other relatively low level values are provided using the NMOS transistors as the pull-up transistors.

Thus, for the maximum level value, there is a situation where both PMOS and NMOS transistors need to be calibrated in the pull-up circuit. In order to save the overall circuit area, in some embodiments, the calibration circuit 302 is further configured to cooperate, in the case where the target data signal corresponds to the maximum level value, with the driver circuit to perform PMOS transistor calibration on the second and fourth pull-up circuits according to the impedance values of the first resistor and the receiving circuit, and then cooperate with the driver circuit to perform NMOS transistor calibration on the first and third pull-up circuits according to the calibration parameters corresponding to the second and fourth pull-up circuits.

That is, in the embodiment of the disclosure, at the highest level, the PMOS transistors need to be calibrated first, and then the NMOS transistors are calibrated. The reason is that first calibrating the NMOS transistors requires a small impedance value, while first calibrating the PMOS transistors requires a large impedance value. Since the smaller the impedance value is, the larger the required size is, in the embodiment of the disclosure, the PMOS transistor is calibrated first and then the NMOS transistor is calibrated, so as to save the overall circuit area.

Further, for the calculation of a plurality of calibration parameters obtained at different output level values, in some embodiments, in the case where n is equal to 4, the target data signal at least includes a first level value, a second level value and a third level value.

Herein, the calibration circuit 302 is configured to cooperate, in the case where the output level value is the first level value, with the driver circuit to perform first calibration according to the impedance values of the first resistor and the receiving circuit to determine first calibration parameters corresponding to the first pull-up circuit and the third pull-up circuit, turn off the receiving circuit and cooperate, in the case where the first calibration parameters corresponding to the first pull-up circuit and the third pull-up circuit are fixed, with the driver circuit to perform second calibration to determine a second calibration parameter corresponding to the pull-down circuit.

Alternatively, the calibration circuit 302 is configured to cooperate, in the case where the output level value is the second level value, with the driver circuit to perform first calibration according to the impedance values of the first resistor and the receiving circuit to determine a third calibration parameter corresponding to the second pull-up circuit and the fourth calibration parameter corresponding to the fourth pull-up circuit, and cooperate, in the case where the calibration parameters corresponding to the second pull-up circuit and the fourth pull-up circuit are fixed to the first preset value, with the driver circuit to perform second calibration to determine a fifth calibration parameter corresponding to the first pull-up circuit.

Alternatively, the calibration circuit 302 is configured to cooperate, in the case where the output level value is the third level value, with the driver circuit to perform first calibration according to the impedance values of the first resistor and the receiving circuit to determine a sixth calibration parameter corresponding to the first pull-up circuit and a seventh calibration parameter corresponding to the third pull-up circuit, and cooperate, in the case where the calibration parameters corresponding to the first pull-up circuit and the third pull-up circuit are fixed to the second preset value, with the driver circuit to perform second calibration to determine an eighth calibration parameter corresponding to the pull-down circuit.

Herein, the first preset value is associated with the third and fourth calibration parameters, and the second preset value is associated with the sixth and seventh calibration parameters.

It is to be noted that, in the embodiment of the disclosure, the first calibration parameter may be represented by $C_0$, the second calibration parameter may be represented by $C_1$, the third calibration parameter may be represented by $C_2$, the fourth calibration parameter may be represented by $C_3$, the fifth calibration parameter may be represented by $C_4$, the sixth calibration parameter may be represented by $C_5$, the seventh calibration parameter may be represented by $C_6$, and the eighth calibration parameter may be represented by $C_7$. In addition, in the embodiment of the disclosure, the first preset value may be set to $4/3C_2-\frac{4}{9}C_3$, and the second preset value may be set to $\frac{3}{4}(C_5+C_6)$.

It is also to be noted that in the embodiment of the disclosure, the first level value is equal to $\frac{1}{2}V_{DDQ}$, the second level value is equal to $\frac{3}{4}V_{DDQ}$, and the first level value is equal to $\frac{1}{4}V_{DDQ}$. Exemplarily, assuming that $V_{DDQ}$ is 0.6V, the first level value is 0.3V, the second level value is 0.45V, and the third level value is 0.15V.

Specifically, in the case where the output level value is $\frac{1}{2}V_{DDQ}$, the impedance value Rx of the first resistor R1 is equal to the impedance value Rx of the receiving circuit 304, both of which are equal to $Z_0$ at the moment. In this case, a first calibration loop is processed in cooperation with the driver circuit 301, so that the first calibration parameters $C_0$ corresponding to the first pull-up circuit 311 and the third pull-up circuit 321 may be determined. And the receiving circuit 304 is turned off, and a second calibration loop is processed using $C_0$ in further cooperation with the driver circuit 301, so that the second calibration parameter $C_1$ corresponding to the pull-down circuit 313 may be determined (it is to be noted that the receiving circuit 304 is in a turn-off state at the moment). In the case where the output level value is $\frac{3}{4}V_{DDQ}$, the impedance value Rx of the first resistor R1 is different from the impedance value Rx of the receiving circuit 304. At the moment, the first resistor R1 is equal to $Z_0$, but Rx is equal to $Z_0+\Delta 1$. In this case, first, processing on the first calibration loop is performed in cooperation with the driver circuit 301. At the moment, only the PMOS transistor in the pull-up transistor is turned on, so that the third calibration parameter $C_2$ corresponding to the second pull-up circuit 312 and the fourth calibration parameter $C_3$ corresponding to the fourth pull-up circuit 322 may be determined. Then, the calibration parameter corresponding to the PMOS transistor is fixed to $4/3C_2-\frac{4}{9}C_3$ to further cooperate with the driver circuit 301 to perform processing on the second calibration loop, so that the fifth calibration parameter $C_4$ corresponding to the first pull-up circuit 311 may be determined. In the case where the output level value is $\frac{1}{4}V_{DDQ}$, the first resistor R1 is also different from the impedance value Rx of the receiving circuit 304. At the moment, the first resistor R1 is equal to $Z_0$, but Rx is equal to $Z_0-\Delta 2$. In this case, first, processing on the first calibration loop is performed in cooperation with the driver circuit 301. At the moment, only the NMOS transistor in the pull-up transistor is turned on, so that the sixth calibration parameter $C_5$ corresponding to the first pull-up circuit 311 and the seventh calibration parameter $C_6$ corresponding to the third pull-up circuit 321 may be determined. Then, the calibration parameter corresponding to the NMOS transistor is fixed to $\frac{3}{4}(C_5+C_6)$ to further cooperate with the driver circuit 301 to perform processing on the second calibration loop to determine the eighth calibration parameter $C_7$ corresponding to the pull-down circuit 313. Here, $\Delta 1$ and $\Delta 2$ are resistance variations of the MOS transistor at different drain voltages, and the specific values are set according to an actual situation, without any limitation here.

Thus, according to $C_0 \sim C_7$ obtained by calibration, the impedance matching relationship can be maintained at different output level values on the premise of ensuring good output linearity.

It is also to be noted that in the embodiment of the disclosure, based on the impedance matching circuit 30 shown in FIG. 3, referring to FIG. 4, the impedance matching circuit 30 may further include a first processing circuit 305, a second processing circuit 306 and a third processing circuit 307.

The first processing circuit 305 may include a first comparator a1 and a first CNT b1, and is configured to receive a reference voltage and a first output voltage through the first comparator a1, output a first comparison result of the reference voltage and the first output voltage, receive the first comparison result and a calibration clock signal through the first CNT b1, and control the first CNT to perform a counting operation when the calibration clock signal indicates to be in a calibration mode and the first comparison result meets a preset condition, to determine a first counting result. Herein, the first counting result is used to determine the calibration parameter corresponding to the first pull-up circuit 311 or the second pull-up circuit 312 at different output level values.

The second processing circuit 306 includes a second comparator a2 and a second CNT b2, and is configured to receive the reference voltage and the first output voltage through the second comparator a2, output a second comparison result of the reference voltage and the first output voltage, receive the second comparison result and the calibration clock signal through the second CNT b2, and control the second CNT to perform the counting operation when the calibration clock signal indicates to be in the calibration mode and the second comparison result meets a preset condition, so as to determine the second counting result. Herein, the second counting result is used to determine corresponding calibration parameters of the pull-down circuit 313 at different output level values.

The third processing circuit 307 may include a third comparator a3 and a third CNT b3, and is configured to receive the reference voltage and the second output voltage through the third comparator a3, output a third comparison result of the reference voltage and the second output voltage, receive the third comparison result and the calibration clock signal through the third CNT b3, and control the third CNT to perform the counting operation when the calibration clock signal indicates to be in the calibration mode and the third comparison result meets the preset condition, so as to determine the third counting result. Herein, the third counting result is used to determine the calibration parameter corresponding to the third pull-up circuit 321 or the fourth pull-up circuit 322 at different output level values.

Herein, the first output voltage represents a voltage value at the output of the driver circuit 301, and the second output voltage represents a voltage value at the output of the calibration circuit 302.

It is to be noted that, in the embodiment of the disclosure, the reference voltage is represented by $V_{ref}$, and the calibration clock signal is represented by $CLK_{ZQ}$. For the CNT, whether it is the first CNT b1, the second CNT b2 or the third CNT b3, each CNT here needs to receive the $CLK_{ZQ}$ signal to control the start and end of ZQ calibration.

It is also to be noted that, in the embodiment of the disclosure, the counting operations of the first CNT b1, the second CNT b2 and the third CNT b3 are the same. Exemplarily, taking the first CNT b1 as an example, it may be judged whether each calibration is completed by comparing the reference voltage with the first output voltage, so as to control the first CNT b1 to perform the counting operation. Here, the judgment basis may be that the reference voltage is equal to the first output voltage, but actually the equality may not be achieved. At the moment, the judgment basis may be that the first output voltage is larger than the reference voltage in the first comparison and the first output voltage is smaller than the reference voltage in the second comparison, so the calibration parameter is between a counting value in the first comparison and a counting value in the second comparison (in general, to reduce the error, it is usually necessary to cycle the process at least two to three times).

In addition, it is also to be noted that for the counting operation of each CNT, an operation of adding a preset step size or subtracting a preset step size may be performed after each comparison result. The preset step size here may be 1, 2, 3, 4, etc. That is, the operations of adding 1, subtracting 1, adding 2, subtracting 2, etc. may be performed, which is not limited in the embodiment of the present disclosure.

Thus, for the first comparator a1 and the first CNT b1, calibration parameters $C_0$, $C_2$, $C_4$ and $C_5$ may be determined by comparing the first output voltage with the reference voltage at different output level values and under the counting operation of the first CNT b1. For the second comparator a2 and the second CNT b2, at different output level values, calibration parameters $C_1$ and $C_7$ may be determined by comparing the first output voltage with the reference voltage and under the counting operation of the second CNT b2. For the third comparator a3 and the third CNT b3, at different output level values, calibration parameters $C_0$, $C_3$ and $C_6$ may be determined by comparing the second output voltage with the reference voltage and under the counting operation of the third CNT b3. Thus, after $C_0$, $C_1$, $C_2$, $C_3$, $C+$, $C_5$, $C_6$ and $C_7$ are obtained, they may be used to determine the respective target calibration parameter of at least one transistor slice in the driver circuit 301, so as to perform impedance adjustment on the at least one transistor slice, to form an impedance matching relationship between the impedance value of the driver circuit 301 and the impedance value of the receiving circuit 304 at different output level values.

It is also to be understood that, in the embodiment of the disclosure, for the driver circuit 301 and the calibration circuit 302, in some embodiments, the first pull-up circuit 311 may include at least one first-type transistor slice, the second pull-up circuit 312 may include at least one second-type transistor slice, the third pull-up circuit 321 may include at least one third-type transistor slice, the fourth pull-up circuit 322 may include at least one fourth-type transistor slice, and the pull-down circuit 313 may include at least one fifth-type transistor slice.

In the first pull-up circuit 311, the first-type transistor slice includes a plurality of NMOS transistors.

In the second pull-up circuit 312, the second-type transistor slice includes a plurality of PMOS transistors.

In the third pull-up circuit 321, the third-type transistor slice includes a plurality of NMOS transistors.

In the fourth pull-up circuit 322, the fourth-type transistor slice includes a plurality of PMOS transistors.

In the pull-down circuit 313, the fifth-type transistor slice includes a plurality of NMOS transistors.

It is to be noted that in the driver circuit 301, the first pull-up circuit 311 may include one or more first-type transistor slices, and the one or more first-type transistor slices are connected in parallel, so as to adjust a parallel resistance of the first pull-up circuit 311. The second pull-up circuit 312 may include one or more second-type transistor slices, and the one or more second-type transistor slices are connected in parallel so as to adjust the parallel resistance of the second pull-up circuit 312. The pull-down circuit 313 may include one or more fifth-type transistor slices, and the one or more fifth-type transistor slices are connected in parallel so as to adjust the parallel resistance of the pull-down circuit 313. Thus, resistance of the pull-up resistor and pull-down resistor corresponding to the driver circuit 301 may be adjusted according to the parallel resistance of the first pull-up circuit 311, the parallel resistance of the second pull-up circuit 312 and the parallel resistance of the pull-down circuit 313, so as to be match with the impedance value of the receiving circuit 304 connected to the output of the driver circuit 301.

It is also to be noted that, in the calibration circuit 302, the third pull-up circuit 321 may include one or more first-type transistor slices, and the one or more first-type transistor slices are connected in parallel to adjust the parallel resistance of the third pull-up circuit 321. The fourth pull-up circuit 322 may include one or more second-type transistor slices, and the one or more second-type transistor slices are connected in parallel to adjust the parallel resistance of the fourth pull-up circuit 322. Thus, resistance of the pull-up resistor corresponding to the calibration circuit 302 may be adjusted according to the parallel resistance of the third pull-up circuit 321 and the parallel resistance of the fourth pull-up circuit 322, so as to be matched with the first resistor R1 (the resistance is equal to $Z_0$) connected to the output of the calibration circuit 302.

Figure 5:
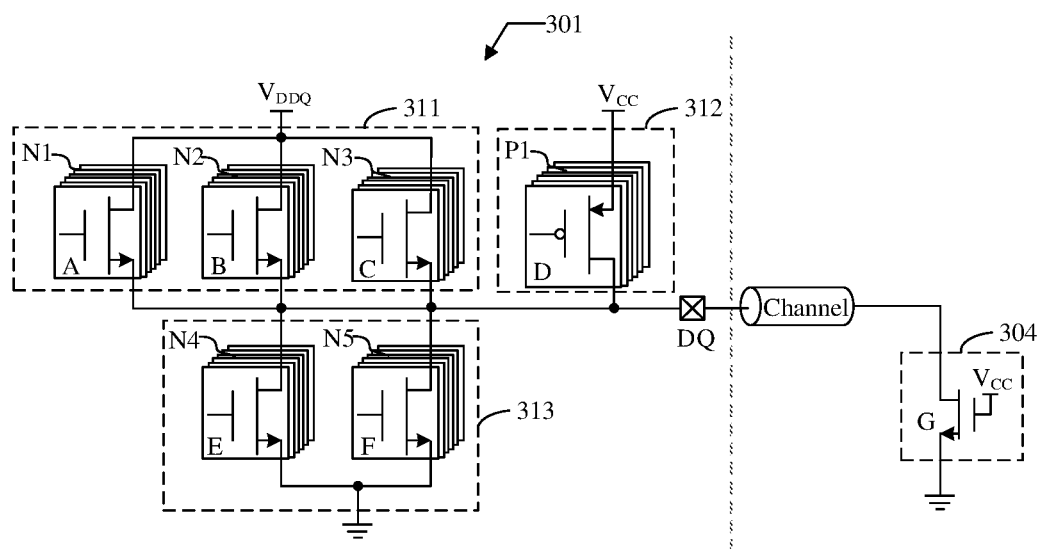
FIG. 5 is a structure diagram of a driver circuit according to an embodiment of the disclosure.

Further, in some embodiments, based on the impedance matching circuit 30 shown in FIG. 4, referring to FIG. 5, for the driver circuit 301, at least one first-type transistor slice may include a first transistor slice N1, a second transistor slice N2 and a third transistor slice N3; and at least one second-type transistor slice may include a fourth transistor slice P1, and at least one fifth-type transistor slice may include a fifth transistor slice N4 and a sixth transistor slice N5.

Herein, in the first pull-up circuit 311, the first transistor slice N1 may include a plurality of NMOS transistors, the second transistor slice N2 may include a plurality of NMOS transistors, and the third transistor slice N3 may include a plurality of NMOS transistors.

In the second pull-up circuit 312, the fourth transistor slice P1 may include a plurality of PMOS transistors.

In the pull-down circuit 313, the fifth transistor slice N4 may include a plurality of NMOS transistors, and the sixth transistor slice N5 may include a plurality of NMOS transistors.

It is to be noted that, in the embodiment of the disclosure, the first pull-up circuit 311 here may include three transistor slices (for example, the first transistor slice N1, the second transistor slice N2 and the third transistor slice N3). The second pull-up circuit 312 here may include one transistor slice (for example, the fourth transistor slice P1). For both the first pull-up circuit 311 and the second pull-up circuit 312, the number of transistor slices included therein is specifically set according to an actual application scenario, which is not limited here.

Thus, FIG. 5 is taken as a specific example. For the first pull-up circuit 311, the parallel resistance of the first pull-up circuit 311 may be adjusted through the first transistor slice N1, the second transistor slice N2 and the third transistor slice N3. For the second pull-up circuit 312, the parallel resistance of the second pull-up circuit 312 may be adjusted through the fourth transistor slice P1. Then, resistance of the pull-up resistor corresponding to the driver circuit 301 may also be adjusted according to the parallel resistance of the first pull-up circuit 311 and the parallel resistance of the second pull-up circuit 312, so as to change a voltage division result.

It is also to be noted that, in the embodiment of the disclosure, the pull-down circuit 313 here may include two transistor slices (for example, the fifth transistor slice N4 and the sixth transistor slice N5), but the number of transistor slices included is specifically set according to the actual application scenario, which is not limited here.

Thus, still taking FIG. 5 as a specific example, for the pull-down circuit 313, resistance of the pull-down resistor corresponding to the driver circuit 301 may be adjusted through the fifth transistor slice N4 and the sixth transistor slice N5, so as to change the voltage division result.

In the embodiment of the disclosure, as shown in FIG. 5, the first transistor slice N1 may include a first main leg A and at least one first auxiliary transistor, the second transistor slice N2 may include a second main leg B and at least one second auxiliary transistor, the third transistor slice N3 may include a third main leg C and at least one third auxiliary transistor, the fourth transistor slice P1 may include a fourth main leg D and at least one fourth auxiliary transistor, the fifth transistor slice N4 may include a fifth main leg E and at least one fifth auxiliary transistor, and the sixth transistor slice N5 may include a sixth main leg F and at least one sixth auxiliary transistor. That is, six transistor slices are shown in FIG. 5, and each transistor slice is composed of a main leg and at least one auxiliary transistor controlled by a target calibration parameter. However, the number of transistor slices and the number of auxiliary transistors are not limited here.

Further, in some embodiments, for the first main leg A, the second main leg B, the third main leg C, the fourth main leg D, the fifth main leg E and the sixth main leg F.

A drain electrode of the first main leg A, a drain electrode of the second main leg B and a drain electrode of the third main leg C are all connected to the first power supply. A gate electrode of the first main leg A is configured to receive a first drive signal, a gate electrode of the second main leg B is configured to receive a second drive signal, a gate electrode of the third main leg C is configured to receive a third drive signal, and a source electrode of the first main leg A, a source electrode of the second main leg B and a source electrode of the third main leg C are all connected to an output node.

The source electrode of the fourth main leg D is connected to a second power supply, the gate electrode of the fourth main leg D is configured to receive the fourth drive signal, and the drain electrode of the fourth main leg D is connected to the output node.

The source electrode of the fifth main leg E and the source electrode of the sixth main leg F are both grounded, the gate electrode of the fifth main leg E is configured to receive the fifth drive signal, the gate electrode of the sixth main leg F is configured to receive the sixth drive signal, and the drain electrode of the fifth main leg E and the drain electrode of the sixth main leg F are both connected to the output node.

It is to be noted that, in the embodiment of the disclosure, the output node is configured to output a target data signal based on PAMn. Referring to FIG. 5 for the specific, the output node may be represented by DQ. Herein, the source electrode of the first main leg A, the source electrode of the second main leg B, the source electrode of the third main leg C, the drain electrode of the fourth main leg D, the drain electrode of the fifth main leg E and the drain electrode of the sixth main leg F are all connected to the output node DQ, and are used for outputting a target data signal based on PAMn. The target data signal is a to-be-transmitted DQ signal. The DQ signal may be transmitted to the receiving circuit 304 through the channel.

It is also to be noted that, in the embodiment of the disclosure, the first drive signal, the second drive signal, the third drive signal, the fourth drive signal, the fifth drive signal and the sixth drive signal may be determined by logic operations according to an Most Significant Bit (MSB) signal and an Least Significant Bit (LSB) signal included in an input signal.

Thus, each transistor slice may include a main leg and at least one auxiliary transistor. Specifically, the first transistor slice N1 may include a first main leg A and at least one first auxiliary transistor, and the turn-on and turn-off of the at least one first auxiliary transistor can perform resistance adjustment on the driving resistance of the first main leg A, so as to adjust the driving capability of the first main leg A. The second transistor slice N2 may include a second main leg B and at least one second auxiliary transistor, and the turn-on and turn-off of the at least one second auxiliary transistor can perform resistance adjustment on the driving resistance of the second main leg B, so as to adjust the driving capability of the second main leg B. The third transistor slice N3 may include a third main leg C and at least one third auxiliary transistor, and the turn-on and turn-off of the at least one third auxiliary transistor can perform resistance adjustment on the driving resistance of the third main leg C, so as to adjust the driving capability of the third main leg C. The fourth transistor slice P1 may include a fourth main leg D and at least one fourth auxiliary transistor, and the turn-on and turn-off of the at least one fourth auxiliary transistor can perform resistance adjustment on the driving resistance of the fourth main leg D, so as to adjust the driving capability of the fourth main leg D, thereby implementing the adjustment of the pull-up driving capability of the driving circuit 10. Further, the fifth transistor slice N4 may include a fifth main leg E and at least one fifth auxiliary transistor, and the turn-on and turn-off of the at least one fifth auxiliary transistor can perform resistance adjustment on the driving resistance of the fifth main leg E, so as to adjust the driving capability of the fifth main leg E. The sixth transistor slice N5 may include a sixth main leg F and at least one sixth auxiliary transistor, and the turn-on and turn-off of the at least one sixth auxiliary transistor can perform resistance adjustment on the driving resistance of the sixth main leg F, so as to adjust the driving capability of the sixth main leg F, thereby adjusting the pull-down driving capability of the driving circuit 10.

In a specific embodiment, the first main leg A, the second main leg B, the third main leg C and the fourth main leg D are pull-up transistors, and the fifth main leg E and the sixth main leg F are pull-down transistors. Furthermore, the first main leg A, the second main leg B, the third main leg C, the fifth main leg E and the sixth main leg F are NMOS transistors, and the fourth main leg D is a PMOS transistor.

As shown in FIG. 5, the drain electrode of the first main leg A, the drain electrode of the second main leg B and the drain terminal of the third main leg C are all connected to a power supply $V_{DDQ}$, the source electrode of the fourth main leg D is connected to a power supply $V_{CC}$, the source electrode of the fifth main leg E and the source electrode of the sixth main leg F are both grounded, and the source electrode of the first main leg A, the source electrode of the second main leg B, the source electrode of the third main leg C, the drain electrode of the fourth main leg D, the drain electrode of the fifth main leg E and the drain electrode of the sixth main leg F are all connected to the output node DQ for outputting the target data signal based on the PAMn. Herein, the value of the power supply $V_{DDQ}$ is lower than the value of the power supply $V_{CC}$, so that on the one hand, each main leg works in a linear resistance area, and on the other hand, the voltage of the output node meets the requirements. Exemplarily, the value of the power supply $V_{DDQ}$ is 0.6 V, and the value of the power supply $V_{CC}$ is 1.05 V, but same is not specifically limited.

In addition, the gate electrode of the first main leg A is configured to receive the first drive signal (represented by $DR_A$), the gate electrode of the second main leg B is configured to receive the second drive signal (represented by $DR_B$), the gate electrode of the third main leg C is configured to receive the third drive signal (represented by $DR_C$), the gate electrode of the fourth main leg D is configured to receive the fourth drive signal (represented by $DR_D$), the gate electrode of the fifth main leg E is configured to receive the fifth drive signal (represented by $DR_E$), and the gate electrode of the sixth main leg F is configured to receive the sixth drive signal (represented by $DR_F$). Here, the first drive signal, the second drive signal, the third drive signal, the fourth drive signal, the fifth drive signal and the sixth drive signal may all be determined by logic operations according to an MSB signal and an LSB signal included in the input signal.

It is to be noted that, in the embodiment of the disclosure, a PAM coding circuit (not shown in the figure) may also be included here. Herein, the PAM coding circuit is configured to perform PAMn-based coding on the received data to generate an input signal, and the input signal at least includes an MSB signal and an LSB signal.

In some embodiments, the determination of these drive signals is specifically as follows.

The first drive signal may be an LSB signal.

The second drive signal may be obtained by an OR logic operation of the MSB signal and the LSB signal.

The third drive signal may be an MSB signal.

The fourth drive signal may be obtained by an OR logic operation of NOT signals of the MSB signal and the LSB signal.

The fifth drive signal may be obtained by a NOT logic operation of the first drive signal.

The sixth drive signal may be obtained by a NOT logic operation of the second drive signal.

In the embodiment of the disclosure, the original input signal is two unrelated binary random codes, one is the MSB signal and the other is the LSB signal. Thus, considering the use of Gray coding, the $DR_A$ signal may be the LSB signal, the $DR_B$ signal may be obtained by an OR logical operation of the MSB signal and the LSB signal, the $DR_C$ signal may be the MSB signal, the $DR_D$ signal may be obtained by an OR logic operation of the MSB signal and the LSB signal, the $DR_E$ signal may be obtained by a NOT logic operation of the $DR_A$ signal, and the $DR_F$ signal may be obtained by a NOT logic operation of the $DR_B$ signal. The above signals are expressed by mathematical formula as follows:

$$DR_A = LSB \tag{4}$$

$$DR_B = MSB + LSB \tag{5}$$

$$DR_C = MSB \tag{6}$$

$$DR_D = \overline{MSB} + \overline{LSB} \tag{7}$$

$$DR_E = \overline{DR_A} \tag{8}$$

$$DR_F = \overline{DR_B} \tag{9}$$

Further, in some embodiments, in the case where n is equal to 4, the target data signal may include a first level value, a second level value, a third level value and a fourth level value.

Herein, when the input signal is 11, the first main leg A, the second main leg B and the third main leg C are in a turn-on state, so that the level of the target data signal is the first level value.

When the input signal is 01, the first main leg A, the second main leg B and the fourth main leg D are in a turn-on state, so that the level of the target data signal is the second level value.

When the input signal is 10, the second main leg B, the third main leg C and the fifth main leg E are in a turn-on state, so that the level of the target data signal is the third level value.

When the input signal is 00, the fifth main leg E and the sixth main leg F are in a turn-on state, so that the level of the target data signal is the fourth level value.

It is to be noted that, in the embodiment of the disclosure, if n=4, the target data signal is a PAM4-based signal having four level values, that is, the first level value, the second level value, the third level value and the fourth level value.

It is also to be noted that, in the embodiment of the disclosure, different input signals correspond to different states. Here, the input signal includes 00, 01, 10 and 11. That is, there are four corresponding states, and these four states correspond to four level values of the target data signal. Herein, in the first state, when the input signal is 11, the first main leg A, the second main leg B and the third main leg C are correspondingly turned on, and other main legs are in a turn-off state, and the level of the target data signal is the first level value at the moment. In the second state, when the input signal is 01, the first main leg A, the second main leg B and the fourth main leg D are correspondingly turned on, and other main legs are in the turn-off state, and the level of the target data signal is the second level value at the moment. In the third state, when the input signal is 10, the second main leg B, the third main leg C and the fifth main leg E are correspondingly turned on, and other main legs are in the turn-off state, then the level of the target data signal is the third level value at the moment. In the fourth state, when the input signal is 00, the fifth main leg E and the sixth main leg F are correspondingly turned on, and other main legs are in the turn-off state, and the level of the target data signal is the fourth level value at the moment. Thus, in different states, by controlling the turn-on and turn-off of these main legs, impedance matching may be performed on the main legs and the receiving end, thus not only improving the signal integrity, but also improving the signal linearity.

Exemplarily, it is assumed that for the NMOS transistor, 1 indicates that the main leg is in a turn-on state, and 0 indicates that the main leg is in a turn-off state. For the PMOS transistor, 0 indicates that the main leg is in the turn-on state, and 1 indicates that the main leg is in the turn-off state. Then, with reference to the driver circuit shown in FIG. 5, Table 1 shows the turn-on and turn-off of each main leg at each input signal.

TABLE 1

| Input signal | First main leg A | Second main leg B | Third main leg C | Fourth main leg D | Fifth main leg E | Sixth main leg F |
|---|---|---|---|---|---|---|
| 01 | 1 | 1 | 0 | 0 | 0 | 0 |
| 11 | 1 | 1 | 1 | 1 | 0 | 0 |
| 10 | 0 | 1 | 1 | 1 | 1 | 0 |
| 00 | 0 | 0 | 0 | 1 | 1 | 1 |

In some embodiments, the first level value is smaller than the second level value, the third level value is smaller than the first level value, and the fourth level value is smaller than the third level value.

It is to be noted that in the embodiment of the disclosure, the second level value is the highest, and the fourth level value is the lowest. That is, when the input signal is 01, the highest level value (that is, the second level value) is output. When the input signal is 11, the next highest level value (that is, the first level value) is output. By analogy, when the input signal is 00, the lowest level value (that is, the fourth level value) is output. Thus, only when the highest level value is output, the combination of the NMOS transistor(s) and the PMOS transistor(s) can be used as the pull-up transistors to turn on. When other level values are output, the NMOS transistor is used as the pull-up transistor to turn on, so that the power consumption can be reduced.

It is also to be noted that, in the embodiment of the disclosure, for each transistor slice, the target calibration parameter determined by the digital logic circuit 303 needs to be used for impedance adjustment thereon. In some embodiments, the plurality of calibration parameters are composed of a first calibration parameter $C_0$, a second calibration parameter $C_1$, a third calibration parameter $C_2$, a fourth calibration parameter $C_3$, a fifth calibration parameter $C_4$, a sixth calibration parameter $C_5$, a seventh calibration parameter $C_6$ and an eighth calibration parameter $C_7$.

The digital logic circuit 303 is further configured to acquire the respective main code of at least one transistor slice, and determine the respective target calibration parameter of the at least one transistor slice according to the first calibration parameter, the second calibration parameter, the third calibration parameter, the fourth calibration parameter, the fifth calibration parameter, the sixth calibration parameter, the seventh calibration parameter, the eighth calibration parameter and the respective main code of the at least one transistor slice.

It is to be noted that, in the embodiment of the disclosure, each transistor slice has its own target calibration parameter. Moreover, for each transistor slice, the target calibration parameter thereof is also related to its own main code. Specifically, by subtracting the corresponding main code, the adjustment range of the target calibration parameter may be reduced, thus achieving higher accuracy and not causing a significant increase of the driving capacitance.

Exemplarily, taking FIG. 5 as an example, at least one transistor slice may include a first transistor slice N1, a second transistor slice N2, a third transistor slice N3, a fourth transistor slice P1, a fifth transistor slice N4 and a sixth transistor slice N5. Then the target calibration parameter may include a first target calibration parameter codeA, a second target calibration parameter codeB, a third target calibration parameter codeC, a fourth target calibration parameter codeD, a fifth target calibration parameter codeE and a sixth target calibration parameter codeF. Thus, for at least one auxiliary transistor in each transistor slice, the target calibration parameter corresponding to the transistor slice may be determined, and then impedance adjustment may be performed based thereon.

In some embodiments, for the at least one first auxiliary transistor, the at least one second auxiliary transistor, the at least one third auxiliary transistor, the at least one fourth auxiliary transistor, the at least one fifth auxiliary transistor and the at least one sixth auxiliary transistor,
the at least one first auxiliary transistor performs impedance adjustment based on the first target calibration parameter, the at least one second auxiliary transistor performs impedance adjustment based on the second target calibration parameter, the at least one third auxiliary transistor performs impedance adjustment based on the third target calibration parameter, the at least one fourth auxiliary transistor performs impedance adjustment based on the fourth target calibration parameter, the at least one fifth auxiliary transistor performs impedance adjustment based on the fifth target calibration parameter, and the at least one sixth auxiliary transistor performs impedance adjustment based on the sixth target calibration parameter.

That is, the target calibration parameter corresponding to the first transistor slice N1 is referred to as the first target calibration parameter codeA, and impedance adjustment may be performed on at least one first auxiliary transistor based on the first target calibration parameter codeA. The target calibration parameter corresponding to the second transistor slice N2 is referred to as the second target calibration parameter codeB, and impedance adjustment may be performed on the at least one second auxiliary transistor based on the second target calibration parameter codeB. The target calibration parameter corresponding to the third transistor slice N3 is referred to as the third target calibration parameter codeC, and impedance adjustment may be performed on the at least one third auxiliary transistor based on the third target calibration parameter codeC. The target calibration parameter corresponding to the fourth transistor slice P1 is referred to as the fourth target calibration parameter codeD, and impedance adjustment on the at least one fourth auxiliary transistor may be performed based on the fourth target calibration parameter codeD. The target calibration parameter corresponding to the fifth transistor slice N4 is referred to as the fifth target calibration parameter codeE, and impedance adjustment may be performed on the at least one fifth auxiliary transistor based on the fifth target calibration parameter codeE. The target calibration parameter corresponding to the sixth transistor slice N5 is referred to as the sixth target calibration parameter codeF, and impedance adjustment may be performed on the at least one sixth auxiliary transistor based on the sixth target calibration parameter codeF.

In a specific embodiment, the digital logic circuit 303 is configured to determine a first target calibration parameter according to the first calibration parameter, the sixth calibration parameter, the seventh calibration parameter and the main code corresponding to the first main leg,
determine a second target calibration parameter according to the first calibration parameter, the fifth calibration parameter, the sixth calibration parameter, the seventh calibration parameter and the main code corresponding to the second main leg,
determine a third target calibration parameter according to the first calibration parameter, the fifth calibration parameter and the main code corresponding to the third main leg, determine a fourth target calibration parameter according to the third calibration parameter, the fourth calibration parameter and the main code corresponding to the fourth main leg, determine a fifth target calibration parameter according to the eighth calibration parameter and the main code corresponding to the fifth main leg, and determine a sixth target calibration parameter according to the second calibration parameter, the eighth calibration parameter and the main code corresponding to the sixth main leg.

In the embodiment of the disclosure, the main code corresponding to the first main leg may be represented by Amain, the main code corresponding to the second main leg may be represented by Bmain, the main code corresponding to the third main leg may be represented by Cmain, the main code corresponding to the fourth main leg may be represented by Dmain, the main code corresponding to the fifth main leg may be represented by Emain, and the main code corresponding to the sixth main leg may be represented by Fmain.

Thus, the first target calibration parameter codeA may be calculated and determined by $C_0$, $C_5$, $C_6$ and Amain, the second target calibration parameter codeB may be calculated and determined by $C_0$, $C_4$, $C_5$, $C_6$ and Bmain, the third target calibration parameter codeC may be calculated and determined by $C_0$, $C_4$ and Cmain, the fourth target calibration parameter codeD may be calculated and determined by $C_2$, $C_3$ and Dmain, the fifth target calibration parameter codeE may be calculated and determined by $C_7$ and Emain, and the sixth target calibration parameter codeF may be calculated and determined by $C_1$, $C_7$ and Fmain. The above calibration parameters are expressed by mathematical formula as follows:

$$codeA = C_o - \tfrac{3}{4}(C_5 + C_6) - A_{main} \tag{10}$$

$$codeB = \tfrac{3}{4}(C_5 + C_6) - C_0 + C_4 - B_{main} \tag{11}$$

$$codeC = C_o - C_4 - C_{main} \tag{12}$$

$$codeD = 4/3 C_2 - \tfrac{1}{3} C_3 - D_{main} \tag{13}$$

$$codeE = C_7 - E_{main} \tag{14}$$

$$codeF = C_1 - C_7 - F_{main} \tag{15}$$

Thus, according to $C_0$, $C_1$, $C_2$, $C_3$, $C_4$, $C_5$, $C_6$ and $C_7$ calibrated at the respective output level values, the target calibration parameters codeA, codeB, codeC, codeD, codeE, and codeF acting on the PAM4-based driver circuit are finally output through the calculation of the digital logic circuit 303. Herein, the operation logic of formulas (10) to (15) is derived according to the following formulas, and the operation logic here also needs to subtract the corresponding main codes. These formulas are as follows.

$$R_{AB} = \frac{3Z_0(Z_0 + \Delta_1)}{Z_0 + 4\Delta_1} \tag{16}$$

$$R_D = \frac{R_{AB} \times Z_0}{R_{AB} - Z_0} = \frac{3Z_0(Z_0 + \Delta_1)}{2Z_0 - \Delta_1} \tag{17}$$

$$R_{ABC} = Z_0 \tag{18}$$

$$R_{BC} = 4[Z_0 // (Z_0 - \Delta_2)] \tag{19}$$

$$R_E = \frac{R_{BC} \times Z_0}{R_{BC} - Z_0} \tag{20}$$

In brief, according to formulas (16) to (20), the operation logic of formulas (10) to (15) may be deduced, and then the target calibration parameters codeA, codeB, codeC, codeD, codeE, and codeF of the PAM4-based driver circuit 301 are determined.

Figure 6:
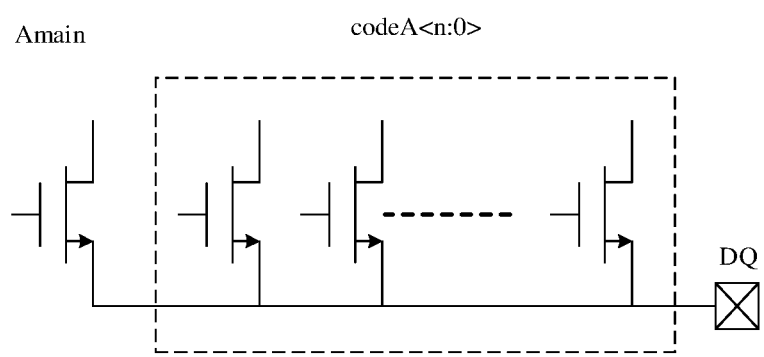
FIG. 6 is a structure diagram of a first transistor slice according to an embodiment of the disclosure.

Exemplarily, taking the first transistor slice as an example, referring to FIG. 6, which illustrates a structure diagram of a first transistor slice according to an embodiment of the disclosure. As shown in FIG. 6, the first transistor slice N1 may include a first main leg A and (n+1) first auxiliary transistors, n being an integer greater than or equal to 0. Herein, the main code corresponding to the first main leg A is Amain, and the first target calibration parameter corresponding to the (n+1) first auxiliary transistors is codeA <n:0>. When calculating the first target calibration parameter codeA, the Amain corresponding to the first main leg A needs to be subtracted, thus reducing the adjustment range of the target calibration parameter. Furthermore, impedance adjustment is performed on the (n+1) first auxiliary transistors according to codeA, so that good output linearity and impedance matching may be achieved.

Figure 7:
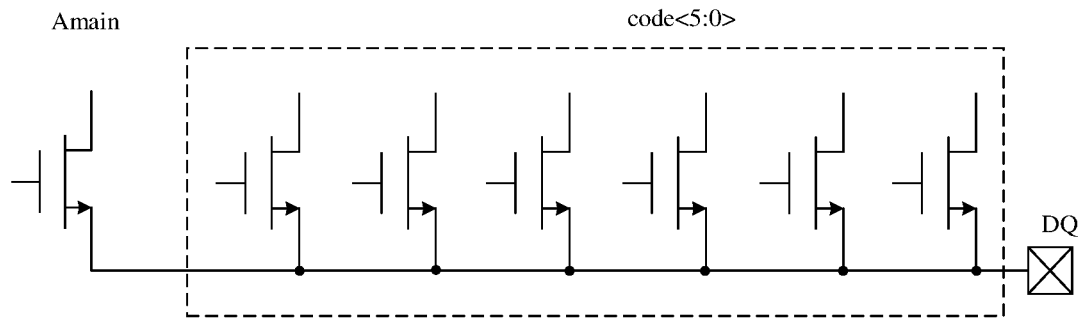
FIG. 7 is a structure diagram of another first transistor slice according to an embodiment of the disclosure.

Taking n equal to 5 as an example, FIG. 7 illustrates a structure diagram of another first transistor slice according to an embodiment of the disclosure. In FIG. 7, the first transistor slice N1 may include a first main leg A and six first auxiliary transistors. For the six first auxiliary transistors, code <5:0> may be used for impedance adjustment, and Amain has been subtracted from the digital logic calculation of code <5:0> to reduce the adjustment range of code <5:0>.

Further, in some embodiments, for the calibration circuit 302, compared with the driver circuit 301, the number of third-type transistor slices included in the third pull-up circuit 321 may be the same as the number of the first-type transistor slices included in the first pull-up circuit 311, and the number of the fourth-type transistor slices included in the fourth pull-up circuit 322 may be the same as the number of the second-type transistor slices included in the second pull-up circuit 312. However, in other embodiments, these numbers may be different, which are not limited in the embodiments of the disclosure. In practical applications, the lowest significant bit represents the same transistor size (resistance). For example, the calibration parameter ZQ is <5:0>, and the target calibration parameter, i.e., final driver, is <4:0>, which corresponds to the lower four bits of the calibration parameter ZQ, and has the same size. Since the final driver has a main leg, the resistance of the main leg may be set as required. Exemplarily, binary code 001 represents 1 um, 010 represents 2 um, 011 represents 3 um, 100 represents 4 um, and 101 represents 5 um. Then, when the main leg is set to 5 um, 101 needs to be subtracted when converting to the code of the final driver. That is, in the embodiment of the disclosure, the code used for ZQ calibration is a binary code with the same resolution as the code used for PAM4-based final driver.

The embodiments of the disclosure provide an impedance matching circuit. In the impedance matching circuit, due to the different transistor types in the driver circuit, the driver circuit is compatible with the advantages of the NMOS and PMOS transistors, thus avoiding the disadvantages of using the NMOS transistor or the PMOS transistor as the pull-up transistor alone. Moreover, impedance adjustment is performed on the at least one transistor slice in the driver circuit by the calibration circuit and the digital logic circuit, to form an impedance matching relationship between the impedance value of the driver circuit and the impedance value of the receiving circuit at different output level values. Therefore, not only can the overall circuit area be saved, but also the signal integrity may be improved and the power consumption may be reduced while the output linearity is ensured, thus effectively improving the data transmission performance.

Figure 8:
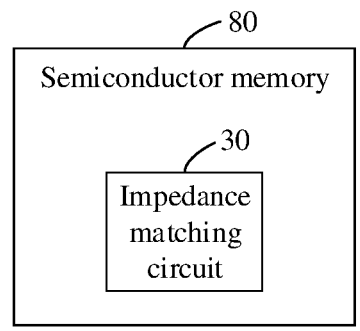
FIG. 8 is a structure diagram of a semiconductor memory according to an embodiment of the disclosure.

In another embodiment of the disclosure, referring to FIG. 8, which illustrates a structure diagram of a semiconductor memory according to an embodiment of the present disclosure. As shown in FIG. 8, the semiconductor memory 80 at least includes the impedance matching circuit 30 of any of the previous embodiments.

Figure 9:
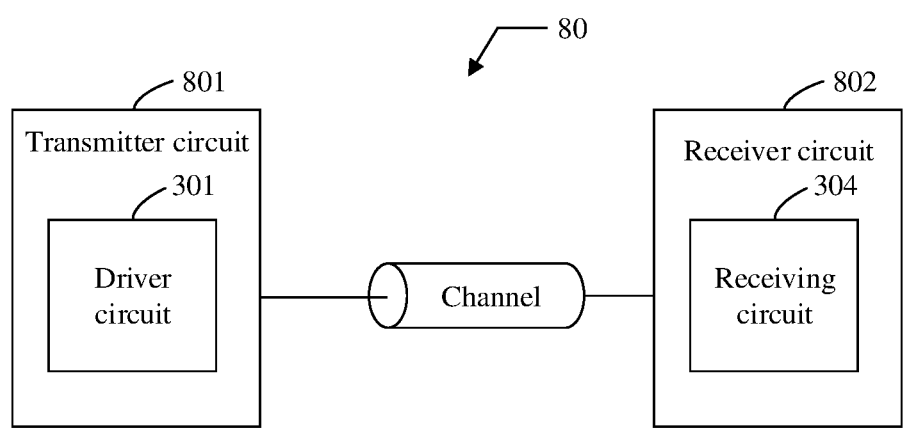
FIG. 9 is a structure diagram of another semiconductor memory according to an embodiment of the disclosure.

In some embodiments, FIG. 9 illustrates a structure diagram of another semiconductor memory according to an embodiment of the disclosure. As shown in FIG. 9, the semiconductor memory 80 may include a transmitter circuit 801 and a receiver circuit 802.

Herein, the transmitter circuit 801 may include a driver circuit 301 configured to output a PAMn-based target data signal.

The receiver circuit 802 may include a receiving circuit 304 configured to receive a target data signal transmitted from the transmitter circuit 801 through a channel.

Herein, there is an impedance matching relationship between the impedance value of the receiver circuit 802 and the impedance value of the transmitter circuit 801.

In the embodiment of the disclosure, the semiconductor memory 80 may be a DRAM. Herein, DRAM can not only meet the memory specifications such as DDR, DDR2, DDR3, DDR4 and DDR5, but also meet the memory specifications such as LPDDR, LPDDR2, LPDDR3, LPDDR4, and LPDDR5, which is not limited here.

In the embodiment of the disclosure, the driver circuit 301 is compatible with a conventional transmitter circuit based on the NRZ signal. Therefore, in some embodiments, the transmitter circuit 801 in the embodiment of the disclosure may support an NRZ mode and a PAMn mode.

Herein, the driver circuit 301 is configured to output an NRZ-based target data signal when the set signal mode is the NRZ mode, or output a PAMn-based target data signal when the set signal mode is the PAMn mode.

That is, in the transmitter circuit 801, the driver circuit 301 can output not only the NRZ-based target data signal, but also the PAMn-based target data signal, which has a good compatibility. That is, in the NRZ mode, the driver circuit 301 may output the NRZ-based target data signal while in the PAMn mode, the driver circuit 301 may output the PAMn-based target data signal.

Further, in the embodiment of the disclosure, for the transmitter circuit 801, the driver circuit therein may employ a mixture of PMOS transistors and NMOS transistors as the pull-up transistors to provide the highest level value output by PAM4, while other lower level values still only employ NMOS transistors as the pull-up transistors. In addition, each transistor is determined by considering two limited conditions, such as impedance matching and output level value. Thus, compared with the PAM4-based circuit in the related art, the transmitter circuit 801 has advantages in both signal integrity and linearity as it implements impedance matching.

Exemplarily, taking FIG. 5 as an example, in the transmitter circuit 801, the driver circuit 301 may include a first transistor slice N1, a second transistor slice N2, a third transistor slice N3, a fourth transistor slice P1, a fifth transistor slice N4, and a sixth transistor slice N5. Herein, the first transistor slice N1 at least includes a first main leg A and at least one first auxiliary transistor, the second transistor slice N2 at least includes a second main leg B and at least one second auxiliary transistor, the third transistor slice N3 at least includes a third main leg C and at least one third auxiliary transistor, the fourth transistor slice P1 at least includes a fourth main leg D and at least one fourth auxiliary transistor, the fifth transistor slice N4 at least includes a fifth main leg E and at least one fifth auxiliary transistor, and the sixth transistor slice N5 at least includes a sixth main leg F and at least one sixth auxiliary transistor. In the receiver circuit 802, the receiving circuit 304 may include a seventh transistor G. Furthermore, transmission is performed between the driver circuit 301 and the receiving circuit 304 through a channel.

In FIG. 5, the first transistor slice N1, the second transistor slice N2, the third transistor slice N3 and the fourth transistor slice P1 are pull-up circuits while the fifth transistor slice N4 and the sixth transistor slice N5 are pull-down circuits. Herein, the transistors in the first transistor slice N1, the second transistor slice N2 and the third transistor slice N3 are of the NMOS-transistor type, and these three transistor slices are powered by the power supply $V_{DDQ}$. The transistors in the fourth transistor slice P1 is of the PMOS-transistor type, which is powered by the power supply $V_{CC}$. The transistors in the fifth transistor slice N4 and the sixth transistor slice N5 are of the NMOS-transistor type. In addition, the seventh transistor G, as a receiving end, has an On-Die Termination (ODT) characteristic, and the impedance value thereof is equal to channel impedance through channel optimization. Here, the transistor type of the seventh transistor G is also an NMOS transistor, and the seventh transistor G is powered by the power supply $V_{CC}$. Thus, since the seventh transistor G has the ODT characteristics, the target data signals can be consumed at a termination resistor to prevent these signals from reflecting on the circuit, thereby improving the signal integrity.

It is to be noted that, in the embodiment of the disclosure, the value of the power supply $V_{DDQ}$ may be 0.6V, and the value of the power supply $V_{CC}$ may be 1.05V.

Thus, the driver circuit 301 in FIG. 5 includes six transistor slices, and each slice may be divided into a main leg and an auxiliary transistor controlled by a target calibration parameter. The turn-on and turn-off of the main legs in the six transistor slices are controlled according to Table 1, and the ZQ calibration method may be used for the PAM4-based transmitter circuit, which can achieve impedance matching at four output level values on the premise of keeping good output linearity.

Figure 10:
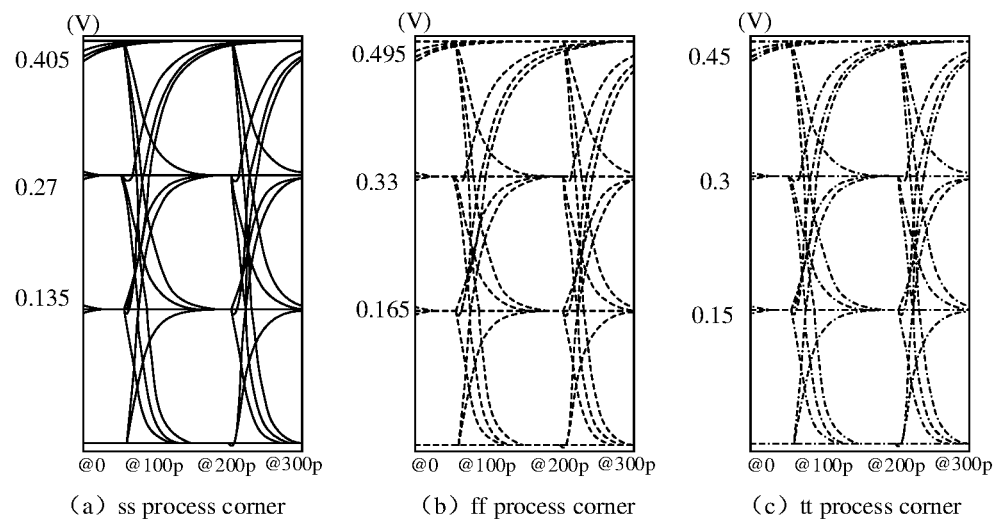
FIG. 10 is a contrast diagram of an eye diagram structure at three process angles according to an embodiment of the disclosure.

Exemplarily, referring to FIG. 10, which illustrates a contrast diagram of an eye diagram structure at three process angles according to an embodiment of the disclosure. As shown in FIG. 10, (a) is an example of an eye diagram of a slow-nmos-slow-pmos (ss) process angle, and the corresponding four output level values are 0.405 V, 0.27 V and 0.135 V. (b) is an example of an eye diagram of a fast-nmos-fast-pmos (ff) process angle, and the corresponding four output level values are 0.495 V, 0.33 V and 0.165 V. (c) is an example of an eye diagram of a typical-nmos-typical-pmos (tt) process angle, and the corresponding four output level values are 0.45 V, 0.3 V and 0.15 V. Here, each eye height is greater than 100 mV. That is, a larger signal swing can be implemented to reduce the demand on the receiving end.

Thus, for the ss process angle, tt process angle and ff process angle, Table 2 shows an example of transistor widths required for calibration at the three process angles. In Table 2, the unit of the transistor width is Micrometre (um).

TABLE 2

| Test condition | ss process angle | tt process angle | ff process angle |
| --- | --- | --- | --- |
| C2-A | 487.4 | 307.2 | 186 |
| C3-A | 643.9 | 398.3 | 244.7 |
| C2-B | 153.7 | 124.2 | 89.14 |
| C3-B | 203.2 | 160.5 | 117 |

It is to be seen that, in the embodiment of the disclosure, for the digital logic operation shown in formulas (10) to (15), ZQ codes at the three process angles are obtained after calibration is performed based on the logic, and good linearity and impedance matching can be achieved by substituting same into the transmitter circuit. In addition, at the highest level value, the pull-up transistors are a mixture of the PMOS transistors and the NMOS transistors. At the moment, it is necessary to calibrate the PMOS transistor first and then the NMOS transistor, which may save the overall circuit area. The reason is that: the NMOS transistor needs a resistance of $Z_0/3\Omega$ for calibration first, while the PMOS transistor only needs a resistance of $4Z_0/3\Omega$ for calibration first. However, the smaller the resistance is, the larger the required size of the transistor is. On the contrary, the larger the resistance is, the smaller the required size of the transistor is. In addition, by subtracting the main code of each main leg in the digital logic operation, the adjustment range of the ZQ code may be reduced, thus achieving higher accuracy and not causing the driving capacitance of the final driver to increase greatly. Here, the driving capacitance here may be represented by pincap, which specifically refers to the capacitance value connected to the output node DQ, and in the embodiment of the disclosure, it is expected that the smaller the capacitance value is, the better the circuit performance is.

Figure 11:
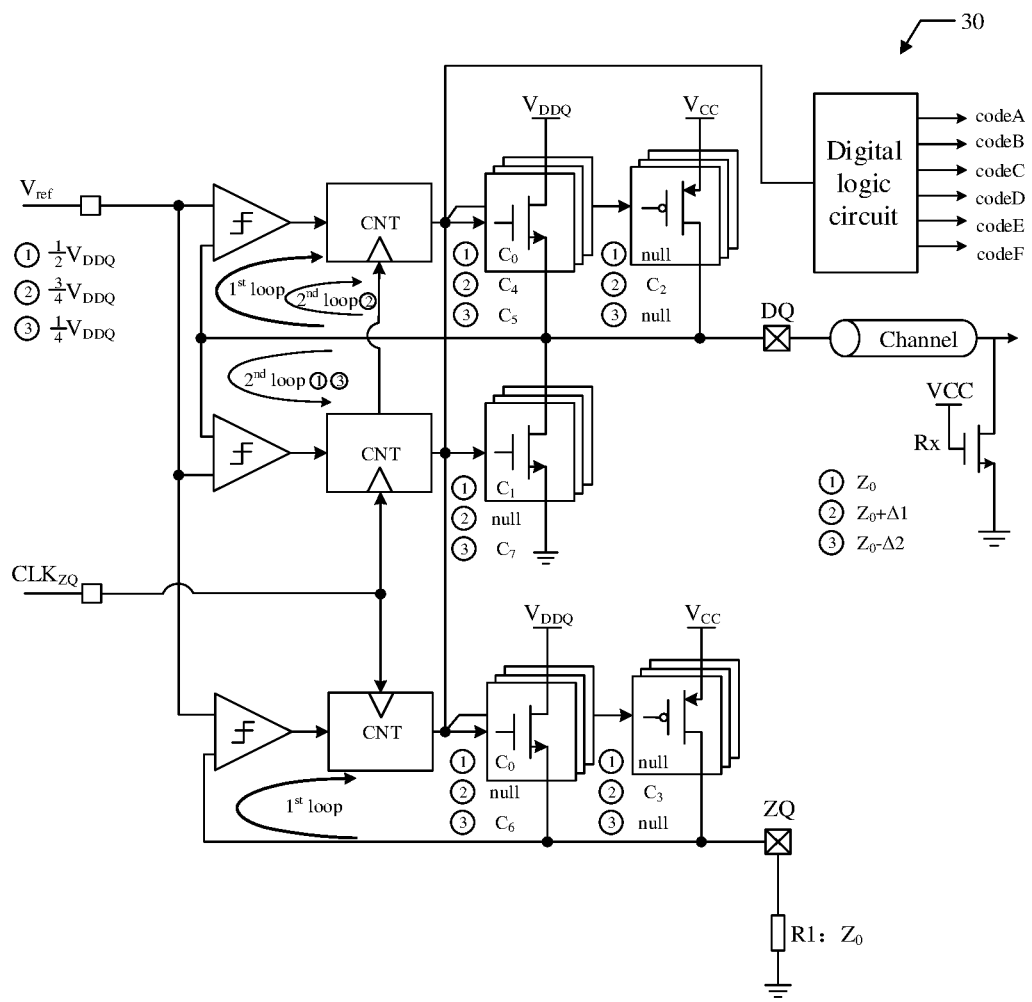
FIG. 11 is a detailed structural diagram of an impedance matching circuit according to an embodiment of the disclosure.

In a specific embodiment, referring to FIG. 11, which illustrates a detailed structural diagram of an impedance matching circuit 30 according to an embodiment of the disclosure. As shown in FIG. 11, the pull-up transistors in the driver circuit may include a group of NMOS transistors and a group of PMOS transistors, and the pull-down transistors in the driver circuit may include a group of NMOS transistors. Moreover, the output of the driver circuit is connected to a first output node DQ and connected to the receiving circuit (the corresponding impedance value is Rx) through a channel. The pull-up transistors in the calibration circuit may include a group of NMOS transistors and a group of PMOS transistors, and the output of the calibration circuit is connected to a second output node ZQ and connected to a first resistor R1 through the second output node ZQ. Here, the resistance of R1 may be $Z_0$.

In addition, ① corresponds to the situation where the output level value is $½V_{DDQ}$, at the moment, the resistance of Rx is $Z_0$, calibration parameters $C_0$ and $C_1$ may be determined, and null indicates null. ② corresponds to the situation where the output level value is $¾V_{DDQ}$, at the moment, the resistance of Rx is $Z_0-\Delta 1$, calibration parameters $C_2$, $C_3$ and $C_4$ may be determined, and null indicates null. ③ corresponds to the situation where the output level value is $¼V_{DDQ}$, at the moment, the resistance of Rx is $Z_0-\Delta 2$, the calibration parameters $C_5$, $C_6$ and $C_7$ may be determined, and null indicates null. Here, $\Delta 1$ and $\Delta 2$ are preset values, and the specific values are set according to an actual situation, which is not limited here.

Specifically, when the output level value is $½V_{DDQ}$, the first calibration loop calibrates the pull-up transistors with the first resistors R1 and Rx to obtain $C_0$, and the second calibration loop calibrates the pull-down transistors with $C_0$ to obtain $C_1$ (at the moment, the receiving circuit is turned off). When the output level value is $¾V_{DDQ}$, the first calibration loop calibrates the pull-up transistors with the first resistors R1 and Rx to obtain $C_2$ and $C_3$. At the moment, only the PMOS in the pull-up transistors is turned on, and then the PMOS is fixed to $4/3C_2-\%C_3$, so that the second calibration loop calibrates the NMOS in the pull-up transistors to obtain $C_4$. When the output level value is $¼V_{DDQ}$, the first calibration loop calibrates the pull-up transistor with the first resistors R1 and Rx to obtain $C_5$ and $C_6$, and then the NMOS in the pull-up transistors is fixed to $¾(C_5+C_6)$, so that the second calibration loop calibrates the pull-down transistors to obtain $C_7$. Then, the target calibration parameters codeA, codeB, codeC, codeD, codeE and codeF may be determined according to the digital logic operation of formulas (10) to (15). In the process, CNT is a CNT, and whether each calibration is completed is judged by comparing the output voltage with the reference voltage $V_{ref}$. The output voltage may be the first output voltage at the DQ node or the second output voltage at the ZQ node.

It is also to be noted that, in the embodiment of the disclosure, the pull-down transistors in the driver circuit may be reused as an ODT circuit, and at the moment, the resistance required by the ODT characteristics needs to be considered. In addition, in PAM4, when the input signal is 00, considering that the output node DQ needs to be pulled down to 0V, the pull-down transistors may also provide a grounding path. Here, the more pull-down grounding paths are, the faster the pull-down speed of the driver circuit is.

In the embodiment of the disclosure, the specific implementation of the aforementioned embodiment is detailed through the above embodiment. Based on the technical solution of the aforementioned embodiment, it is to be seen that, on one hand, the external first resistor R1 (the resistance thereof is $Z_0$) and Rx at the receiving end are used as the reference for ZQ calibration, and the size of Rx at the moment is the size when the source-drain voltage $V_{DQ}$ of the seventh transistor G in FIG. 5 is $½V_{DDQ}$ and the resistance at the current process angle temperature is $Z_0$ (in other words, the size of RX is fixed already). On another hand, according to the ZQ code calibrated at each output level value, the target calibration parameters (that is, codeA, codeB, codeC, codeD, codeE and codeF) acting on the PAM4-based transmitter circuit are finally output through the calculation of the digital logic circuit. On yet another hand, the digital logic operation here is derived according to the aforementioned formulas (16) to (20), in which the operation logic needs to subtract the main codes (that is, Amain, Bmain, Cmain, Dmain, Emain and Fmain), and the code used for ZQ calibration is a binary code with the same resolution as the code used by the PAM4-based final driver. Therefore, based on the ZQ calibration method, on the premise of ensuring good output linearity, impedance matching is kept at four output level values, so that the signal integrity may be improved. On still yet another hand, when calibrating the highest level value, the PMOS transistor needs to be calibrated first, and the code of the NMOS transistor may be obtained by a second round of calibration according to the obtained code of the PMOS transistor, so that the overall circuit area may also be saved.

Figure 12:
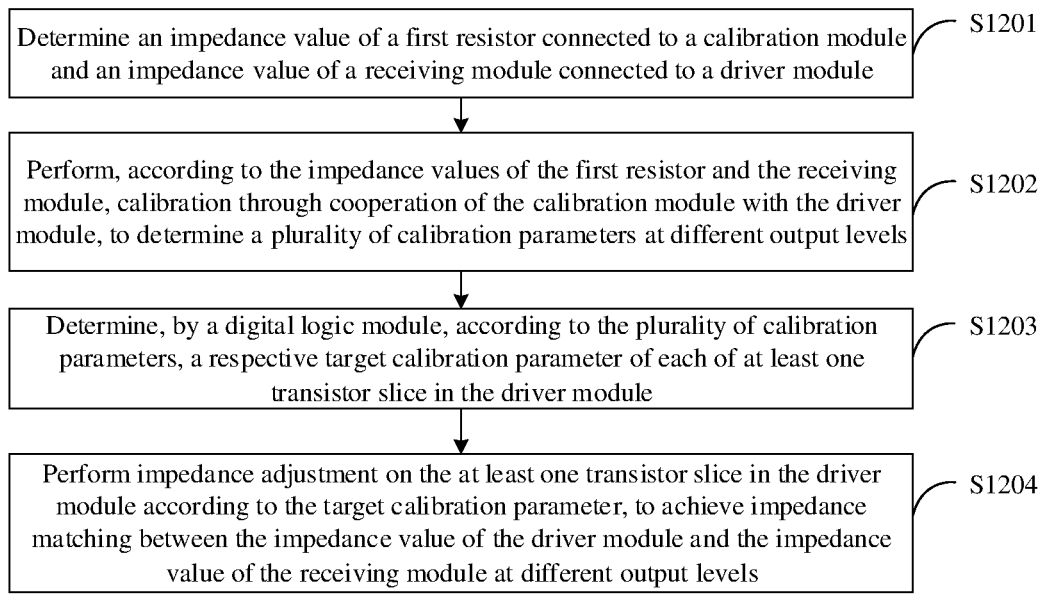
FIG. 12 is a flowchart of a method for impedance matching according to an embodiment of the disclosure.

In yet another embodiment of the disclosure, referring to FIG. 12, which illustrates a flowchart of a method for impedance matching according to an embodiment of the disclosure. As shown in FIG. 12, the method may include the following operations.

At S1201, an impedance value of a first resistor connected to a calibration circuit and an impedance value of a receiving circuit connected to a driver circuit are determined.

At S1202, the calibration circuit cooperates with the driver circuit to perform calibration according to the impedance values of the first resistor and the receiving circuit, to determine a plurality of calibration parameters obtained at different output level values.

At S1203, the respective target calibration parameter of at least one transistor slice in the driver circuit is determined by a digital logic circuit according to the plurality of calibration parameters.

At S1204, impedance adjustment is performed on the at least one transistor slice in the driver circuit according to the target calibration parameter, to form an impedance matching relationship between the impedance value of the driver circuit and the impedance value of the receiving circuit at different output level values.

It is to be noted that, in the embodiment of the disclosure, the method for impedance matching is applied to the impedance matching circuit described in the aforementioned embodiment or the semiconductor memory integrated with the impedance matching circuit. In the impedance matching circuit, for the driver circuit, the output of the driver circuit is connected to the receiving circuit, and the output of the calibration circuit is connected to the first resistor. In addition, the driver circuit includes pull-up transistors and pull-down transistors. The pull-up transistors may be composed of an NMOS transistor(s) and a PMOS transistor(s), and the pull-down transistors may be composed of an NMOS transistor(s). The pull-up transistors in the calibration circuit may also be composed of an NMOS transistor(s) and a PMOS transistor(s).

It is also to be noted that, in the embodiment of the disclosure, the calibration circuit cooperates with the driver circuit to perform calibration, so that a plurality of calibration parameters obtained at different output level values may be determined. Assuming that the driver circuit includes six transistor slices, calibration parameters such as $C_0$, $C_1$, $C_2$, $C_3$, $C_4$, $C_5$, $C_6$ and $C_7$ may be obtained through a calibration loop. Then, combined with a main code, the target calibration parameters codeA, codeB, codeC, codeD, codeE and codeF may be determined using the digital logic operation of formulas (10) to (15), so that impedance adjustment may be performed on the six transistor slices, and there is an impedance matching relationship between the impedance value of the driver circuit and the impedance value of the receiving circuit at different output level values.

In the embodiment of the disclosure, as the pull-up transistors include transistors of both the NMOS-transistor type and the PMOS-transistor type, only when the highest level value is output, the combination of the NMOS transistor and the PMOS transistor may be used as the pull-up transistors to turn on. When other level values are output, only the NMOS transistor is used as the pull-up transistors to turn on. Thus, due to the different transistor types in the driver circuit, the driver circuit is compatible with the advantages of the NMOS and PMOS transistors, thus avoiding the disadvantages of merely using the NMOS transistor(s) or merely using the PMOS transistor(s) as the pull-up transistors. Moreover, impedance adjustment is performed on the at least one transistor slice in the driver circuit by the calibration circuit and the digital logic circuit, to form an impedance matching relationship between the impedance value of the driver circuit and the impedance value of the receiving circuit at different output level values. Therefore, not only can the overall circuit area be saved, but also the signal integrity can be improved and the power consumption can be reduced while the output linearity is ensured, thus effectively improving the data transmission performance.

The foregoing descriptions are only preferred embodiments of the disclosure and are not intended to limit the scope of protection of the disclosure.

It is to be noted that terms "include" and "contain" or any other variant thereof is intended to cover nonexclusive inclusions herein, so that a process, method, object or device including a series of elements not only includes those elements but also includes other elements which are not clearly listed or further includes elements intrinsic to the process, the method, the object or the device. Without further restrictions, the element defined by the statement "including a . . . " does not exclude the existence of another same element in the process, method, article or device including the element.

The sequence numbers of the embodiments of the disclosure are adopted not to represent superiority-inferiority of the embodiments but only for description.

The methods disclosed in several method embodiments provided in the present disclosure may be arbitrarily combined without conflict to obtain a new method embodiment.

The characteristics disclosed in a plurality of product embodiments provided in the present disclosure may be arbitrarily combined without conflict to obtain a new product embodiment.

The characteristics disclosed in the several method or device embodiments provided in the present disclosure may be arbitrarily combined without conflict to obtain a new method embodiment or device embodiment.

The above is only the specific implementation mode of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the present disclosure shall be subject to the scope of protection of the claims.

The embodiments of the disclosure provide an impedance matching circuit, a method for impedance matching and a semiconductor memory. The impedance matching circuit includes a driver circuit, a calibration circuit, a digital logic circuit, a receiving circuit and a first resistor. An output of the driver circuit is connected to the receiving circuit, and an output of the calibration circuit is connected to the first resistor. Herein, the calibration circuit is configured to cooperate with the driver circuit to perform calibration according to the impedance values of the first resistor and the receiving circuit to determine a plurality of calibration parameters at different output level values. The digital logic circuit is configured to receive the plurality of calibration parameters and determine a respective target calibration parameter of each of the at least one transistor slice in the driver circuit. The driver circuit is configured to receive the target calibration parameter, and perform impedance adjustment on the at least one transistor slice according to the target calibration parameter, to form an impedance matching relationship between the impedance value of the driver circuit and the impedance value of the receiving circuit at different output level values. Thus, due to the different transistor types in the driver circuit, the driver circuit has both the advantages of the NMOS and of PMOS transistors, thus avoiding the disadvantages of merely using the NMOS transistor(s) or merely using the PMOS transistor(s) as the pull-up transistor(s). Moreover, impedance adjustment is performed on the at least one transistor slice in the driver circuit by the calibration circuit and the digital logic circuit, so that there is an impedance matching relationship between the impedance value of the driver circuit and the impedance value of the receiving circuit at different output level values. Therefore, not only can the overall circuit area be saved, but also the signal integrity can be improved and the power consumption can be reduced while the output linearity is ensured, thus effectively improving the data transmission performance.

The invention claimed is:

1. An impedance matching circuit, the impedance matching circuit comprising a driver circuit, a calibration circuit, a digital logic circuit, a receiving circuit and a first resistor, wherein an output of the driver circuit is connected to the receiving circuit, an output of the calibration circuit is connected to the first resistor,
   wherein the calibration circuit is configured to cooperate with the driver circuit to perform calibration according to impedance values of the first resistor and the receiving circuit, to determine a plurality of calibration parameters at different output level values,
   wherein the digital logic circuit is configured to receive the plurality of calibration parameters and determine a target calibration parameter of each of at least one transistor slice in the driver circuit, and
   wherein the driver circuit is configured to receive the target calibration parameter, and perform impedance adjustment on the at least one transistor slice according to the target calibration parameter, to form an impedance matching relationship between an impedance value of the driver circuit and the impedance value of the receiving circuit at different output level values.

2. The impedance matching circuit of claim 1, wherein the driver circuit comprises a first pull-up circuit, a second pull-up circuit and a pull-down circuit, and the calibration circuit comprises a third pull-up circuit and a fourth pull-up circuit,
   wherein one end of the first pull-up circuit and one end of the third pull-up circuit are both connected to a first power supply,
   one end of the second pull-up circuit and one end of the fourth pull-up circuit are both connected to a second power supply,
   one end of the pull-down circuit is grounded, the other end of the first pull-up circuit, the other end of the second pull-up circuit and the other end of the pull-down circuit are all connected to an input of the receiving circuit, an output of the receiving circuit is grounded,
   the other end of the third pull-up circuit and the other end of the fourth pull-up circuit are both connected to one end of the first resistor, and the other end of the first resistor is grounded.

3. The impedance matching circuit of claim 2, wherein transistors in the first pull-up circuit and the third pull-up circuit are an N-channel Metal Oxide Semiconductor (NMOS) transistors,
   transistors in the second pull-up circuit and the fourth pull-up circuit are a P-channel Metal Oxide Semiconductor (PMOS) transistors, and
   a transistor in the pull-down circuit is an NMOS transistor.

4. The impedance matching circuit of claim 3, wherein a value of the first power supply is lower than a value of the second power supply.

5. The impedance matching circuit of claim 3, wherein the driver circuit is further configured to output a target data signal based on n-level Pulse Amplitude Modulation (PAMn), n being an integer greater than or equal to 2.

6. The impedance matching circuit of claim 5, wherein
   the calibration circuit is further configured to cooperate, in the case where the target data signal corresponds to a maximum level value, with the driver circuit to perform PMOS transistor calibration on the second and fourth pull-up circuits according to the impedance values of the first resistor and the receiving circuit, and then cooperate with the driver circuit to perform NMOS transistor calibration on the first and third pull-up circuits according to the calibration parameters corresponding to the second and fourth pull-up circuits.

7. The impedance matching circuit of claim 5, wherein in the case where n is equal to 4, the target data signal at least comprises a first level value, a second level value, and a third level value,
   wherein the calibration circuit is configured to cooperate, in the case where the output level value is the first level value, with the driver circuit to perform first calibration according to the impedance values of the first resistor and the receiving circuit to determine first calibration parameters corresponding to the first pull-up circuit and the third pull-up circuit, turn off the receiving circuit and cooperate, in the case where the first calibration parameters corresponding to the first pull-up circuit and the third pull-up circuit are fixed, with the driver circuit to perform second calibration to determine a second calibration parameter corresponding to the pull-down circuit, or
   the calibration circuit is configured to cooperate, in the case where the output level value is the second level value, with the driver circuit to perform first calibration according to the impedance values of the first resistor and the receiving circuit to determine a third calibration parameter corresponding to the second pull-up circuit and a fourth calibration parameter corresponding to the fourth pull-up circuit, and cooperate, in the case where the calibration parameters corresponding to the second pull-up circuit and the fourth pull-up circuit are fixed to a first preset value, with the driver circuit to perform second calibration to determine a fifth calibration parameter corresponding to the first pull-up circuit, or
   the calibration circuit is configured to cooperate, in the case where the output level value is the third level value, with the driver circuit to perform first calibration according to the impedance values of the first resistor and the receiving circuit to determine a sixth calibration parameter corresponding to the first pull-up circuit and a seventh calibration parameter corresponding to the third pull-up circuit, and cooperate, in the case where the calibration parameters corresponding to the first pull-up circuit and the third pull-up circuit are fixed to a second preset value, with the driver circuit to perform second calibration to determine an eighth calibration parameter corresponding to the pull-down circuit,
   wherein the first preset value is associated with the third and fourth calibration parameters, and the second preset value is associated with the sixth and seventh calibration parameters.

8. The impedance matching circuit of claim 7, wherein the impedance matching circuit further comprises a first processing circuit, a second processing circuit and a third processing circuit,
   wherein the first processing circuit comprises a first comparator and a first counter (CNT), and is configured to receive a reference voltage and a first output voltage through the first comparator, output a first comparison result of the reference voltage and the first output voltage, receive the first comparison result and a calibration clock signal through the first CNT, and control, when the calibration clock signal indicates a calibration mode and the first comparison result meets a preset condition, the first CNT to perform a counting operation to determine a first counting result, the first counting result being used to determine the calibration parameters corresponding to the first pull-up circuit or the second pull-up circuit at different output level values,
   wherein the second processing circuit comprises a second comparator and a second CNT, and is configured to receive the reference voltage and the first output voltage through the second comparator, output a second comparison result of the reference voltage and the first output voltage, receive the second comparison result and the calibration clock signal through the second CNT, and control the second CNT to perform the counting operation when the calibration clock signal indicates the calibration mode and the second comparison result meets a preset condition so as to determine a second counting result, the second counting result being used to determine the calibration parameters of the pull-down circuit at different output level values,
   wherein the third processing circuit comprises a third comparator and a third CNT, and is configured to receive the reference voltage and a second output voltage through the third comparator, output a third comparison result of the reference voltage and the second output voltage, receive the third comparison result and the calibration clock signal through the third CNT, and control the third CNT to perform the counting operation when the calibration clock signal indicates the calibration mode and the third comparison result meets the preset condition, so as to determine a third counting result, the third counting result being used to determine the calibration parameters corresponding to the third pull-up circuit or the fourth pull-up circuit at different output level values,
   wherein the first output voltage represents a voltage value at the output of the driver circuit, and the second output voltage represents a voltage value at the output of the calibration circuit.

9. The impedance matching circuit of claim 7, wherein the plurality of calibration parameters are composed of a first calibration parameter, a second calibration parameter, a third calibration parameter, a fourth calibration parameter, a fifth calibration parameter, a sixth calibration parameter, a seventh calibration parameter and an eighth calibration parameter,
   wherein the digital logic circuit is further configured to acquire a respective main code of each of the at least one transistor slice, and determine the respective target calibration parameter of each of the at least one transistor slice according to the first calibration parameter, the second calibration parameter, the third calibration parameter, the fourth calibration parameter, the fifth calibration parameter, the sixth calibration parameter, the seventh calibration parameter, the eighth calibration parameter and the respective main code of each of the at least one transistor slice.

10. The impedance matching circuit of claim 9, wherein the first pull-up circuit comprises at least one first-type transistor slice, the second pull-up circuit comprises at least one second-type transistor slice, the third pull-up circuit comprises at least one third-type transistor slice, the fourth pull-up circuit comprises at least one fourth-type transistor slice, and the pull-down circuit comprises at least one fifth-type transistor slice,
   wherein in the first pull-up circuit, the first-type transistor slice comprises a plurality of NMOS transistors,
   in the second pull-up circuit, the second-type transistor slice comprises a plurality of PMOS transistors,
   in the third pull-up circuit, the third-type transistor slice comprises a plurality of NMOS transistors,
   in the fourth pull-up circuit, the fourth-type transistor slice comprises a plurality of PMOS transistors, and
   in the pull-down circuit, the fifth-type transistor slice comprises a plurality of NMOS transistors.

11. The impedance matching circuit of claim 10, wherein the at least one first-type transistor slice comprises a first transistor slice, a second transistor slice and a third transistor slice, the at least one second-type transistor slice comprising a fourth transistor slice, and the at least one fifth-type transistor slice comprising a fifth transistor slice and a sixth transistor slice,
   wherein in the first pull-up circuit, the first transistor slice comprises a plurality of NMOS transistors, the second transistor slice comprises a plurality of NMOS transistors, and the third transistor slice comprises a plurality of NMOS transistors,
   wherein in the second pull-up circuit, the fourth transistor slice comprises a plurality of PMOS transistors, and
   wherein in the pull-down circuit, the fifth transistor slice comprises a plurality of NMOS transistors, and the sixth transistor slice comprises a plurality of NMOS transistors.

12. The impedance matching circuit of claim 11, wherein the first transistor slice comprises a first main leg and at least one first auxiliary transistor, the second transistor slice comprises a second main leg and at least one second auxiliary transistor, the third transistor slice comprises a third main leg and at least one third auxiliary transistor, the fourth transistor slice comprises a fourth main leg and at least one fourth auxiliary transistor, the fifth transistor slice comprises a fifth main leg and at least one fifth auxiliary transistor, and the sixth transistor slice comprises a sixth main leg and at least one sixth auxiliary transistor,
   wherein the at least one first auxiliary transistor is configured to perform impedance adjustment based on a first target calibration parameter, the at least one second auxiliary transistor is configured to perform impedance adjustment based on a second target calibration parameter, the at least one third auxiliary transistor is configured to perform impedance adjustment based on a third target calibration parameter, the at least one fourth auxiliary transistor is configured to perform impedance adjustment based on a fourth target calibration parameter, the at least one fifth auxiliary transistor is configured to perform impedance adjustment based on a fifth target calibration parameter, and the at least one sixth auxiliary transistor is configured to perform impedance adjustment based on a sixth target calibration parameter.

13. The impedance matching circuit of claim 12, wherein
the digital logic circuit is configured to determine the first
target calibration parameter according to the first calibration parameter, the sixth calibration parameter, the seventh calibration parameter and the main code corresponding to the first main leg, determine the second target calibration parameter according to the first calibration parameter, the fifth calibration parameter, the sixth calibration parameter, the seventh calibration parameter and the main code corresponding to the second main leg, determine the third target calibration parameter according to the first calibration parameter, the fifth calibration parameter and the main code corresponding to the third main leg, determine the fourth target calibration parameter according to the third calibration parameter, the fourth calibration parameter and the main code corresponding to the fourth main leg, determine the fifth target calibration parameter according to the eighth calibration parameter and the main code corresponding to the fifth main leg, and determine the sixth target calibration parameter according to the second calibration parameter, the eighth calibration parameter and the main code corresponding to the sixth main leg.

14. The impedance matching circuit of claim 12, wherein
a drain electrode of the first main leg, a drain electrode of the second main leg and a drain electrode of the third main leg are all connected to the first power supply, a gate electrode of the first main leg is configured to receive a first drive signal, a gate electrode of the second main leg is configured to receive a second drive signal, a gate electrode of the third main leg being configured to receive a third drive signal, and a source electrode of the first main leg, a source electrode of the second main leg and a source electrode of the third main leg are all connected to an output node, wherein the source electrode of the fourth main leg is connected to the second power supply, the gate electrode of the fourth main leg is configured to receive a fourth drive signal, and the drain electrode of the fourth main leg is connected to the output node, wherein the source electrode of the fifth main leg and the source electrode of the sixth main leg are both grounded, the gate electrode of the fifth main leg is configured to receive a fifth drive signal, the gate electrode of the sixth main leg is configured to receive a sixth drive signal, and the drain electrode of the fifth main leg and the drain electrode of the sixth main leg are both connected to the output node, wherein the output node is configured to output a target data signal based on PAMn, the first drive signal, the second drive signal, the third drive signal, the fourth drive signal, the fifth drive signal and the sixth drive signal are determined by logic operations according to a Most Significant Bit (MSB) signal and a Least Significant Bit (LSB) signal included in an input signal.

15. The impedance matching circuit of claim 14, wherein
the first drive signal is the LSB signal,
the second drive signal is obtained by an OR logic operation based on the MSB signal and the LSB signal,
the third drive signal is the MSB signal,
the fourth drive signal is obtained by the OR logic operation based on NOT signals of the MSB signal and the LSB signal,
the fifth drive signal is obtained by an NOT logic operation based on the first drive signal, and
the sixth drive signal is obtained by the NOT logic operation based on the second drive signal.

16. The impedance matching circuit of claim 14, wherein
in the case where n is equal to 4, the target data signal comprises a first level value, a second level value, a third level value and a fourth level value, wherein when the input signal is 11, the first main leg, the second main leg and the third main leg are in a turn-on state, so that a level of the target data signal is the first level value, wherein when the input signal is 01, the first main leg, the second main leg and the fourth main leg are in a turn-on state, so that the level of the target data signal is the second level value, wherein when the input signal is 10, the second main leg, the third main leg and the fifth main leg are in a turn-on state, so that the level of the target data signal is the third level value, wherein when the input signal is 00, the fifth main leg and the sixth main leg are in a turn-on state, so that the level of the target data signal is the fourth level value.

17. The impedance matching circuit of claim 16, wherein
the first level value is smaller than the second level value, the third level value is smaller than the first level value, and the fourth level value is smaller than the third level value.

18. A method for impedance matching, comprising:
determining an impedance value of a first resistor connected to a calibration circuit and an impedance value of a receiving circuit connected to a driver circuit;

enabling, according to the impedance values of the first resistor and the receiving circuit, the calibration circuit to cooperate with the driver circuit to perform calibration, to determine a plurality of calibration parameters at different output level values;

determining, by a digital logic circuit, according to the plurality of calibration parameters, a respective target calibration parameter of each of at least one transistor slice in the driver circuit; and performing, according to the target calibration parameter, impedance adjustment on the at least one transistor slice in the driver circuit, to form an impedance matching relationship between the impedance value of the driver circuit and the impedance value of the receiving circuit at different output level values.

19. A semiconductor memory, the semiconductor memory at least comprising an impedance matching circuit, the impedance matching circuit comprising a driver circuit, a calibration circuit, a digital logic circuit, a receiving circuit and a first resistor, wherein an output of the driver circuit is connected to the receiving circuit, an output of the calibration circuit is connected to the first resistor, wherein the calibration circuit is configured to cooperate with the driver circuit to perform calibration according to impedance values of the first resistor and the receiving circuit, to determine a plurality of calibration parameters at different output level values, wherein the digital logic circuit is configured to receive the plurality of calibration parameters and determine a target calibration parameter of each of at least one transistor slice in the driver circuit, and wherein the driver circuit is configured to receive the target calibration parameter, and perform impedance adjustment on the at least one transistor slice according to the target calibration parameter, to form an impedance matching relationship between an impedance value of the driver circuit and the impedance value of the receiving circuit at different output level values.

20. The semiconductor memory of claim 19, comprising a transmitter circuit and a receiver circuit,
- wherein the transmitter circuit comprises the driver circuit, and is configured to output a target data signal based on n-level Pulse Amplitude Modulation (PAMn),
- wherein the receiver circuit comprises the receiving circuit, and is configured to receive the target data signal transmitted from the transmitter circuit through a channel,
- wherein the impedance value of the receiver circuit and the impedance value of the transmitter circuit have an impedance matching relationship.

\* \* \* \* \*